United States Patent
Cocciadiferro et al.

(10) Patent No.: US 11,789,472 B2
(45) Date of Patent: Oct. 17, 2023

(54) GAS DELIVERY SYSTEM WITH ELECTRICAL BACKPLANE

(71) Applicant: HORIBA STEC, Co., Ltd., Kyoto (JP)

(72) Inventors: Edward Cocciadiferro, Reno, NV (US); John Dick, Reno, NV (US); William W. White, Reno, NV (US); Maximilian Gundlach, Reno, NV (US); Patrick Lowery, Reno, NV (US)

(73) Assignee: HORIBA STEC, Co., Ltd., Kyoto (JP)

( * ) Notice: Subject to any disclaimer, the term of this patent is extended or adjusted under 35 U.S.C. 154(b) by 471 days.

(21) Appl. No.: 17/090,019

(22) Filed: Nov. 5, 2020

(65) Prior Publication Data

US 2021/0223800 A1    Jul. 22, 2021

Related U.S. Application Data

(60) Provisional application No. 62/963,880, filed on Jan. 21, 2020.

(51) Int. Cl.
*G05D 11/13* (2006.01)
*G06N 20/00* (2019.01)
*H01L 21/67* (2006.01)

(52) U.S. Cl.
CPC ........... *G05D 11/132* (2013.01); *G06N 20/00* (2019.01); *H01L 21/67017* (2013.01)

(58) Field of Classification Search
CPC ......... G05D 11/32; G06N 20/00; H01L 21/67
USPC .................................................. 700/275–290
See application file for complete search history.

(56) References Cited

U.S. PATENT DOCUMENTS

| | | | |
|---|---|---|---|
| 5,220,517 A * | 6/1993 | Sierk ..................... | F17C 13/04 700/282 |
| 5,865,205 A * | 2/1999 | Wilmer ................. | G05D 7/0635 73/1.16 |
| 6,119,710 A * | 9/2000 | Brown ................... | G01F 1/88 137/486 |
| 2005/0051233 A1* | 3/2005 | Wodjenski ............ | F17C 13/025 141/104 |
| 2016/0018828 A1* | 1/2016 | Mudd .................... | G05B 15/02 700/282 |

(Continued)

OTHER PUBLICATIONS

Li, Jiawen, and Tao Yu. "Sensors integrated control of PEMFC gas supply system based on large-scale deep reinforcement learning." Sensors 21.2 (2021): pp. 1-19. (Year: 2021).*

(Continued)

*Primary Examiner* — Satish Rampuria
(74) *Attorney, Agent, or Firm* — Alleman Hall Creasman & Tuttle LLP

(57) ABSTRACT

A gas delivery system is provided comprising an electrical backplane, a system controller operatively coupled to the electrical backplane, and a plurality of mass flow controllers. Each mass flow controller includes respective mass flow control circuitry operatively coupled to the electrical backplane. The system controller and each mass flow control circuitry are physically mounted on the electrical backplane. The gas delivery system further comprises a pump/purge system to help eliminate pressure build up in the system and provide a quick stop to a flow process in the system. Accordingly, a row associated with a flow process may be evaluated so that a mass flow controller may be swapped out as needed.

29 Claims, 18 Drawing Sheets

(56) References Cited

U.S. PATENT DOCUMENTS

2016/0041564 A1* 2/2016 Mudd ................ G05D 7/0641
                                                                                       700/275
2017/0031370 A1* 2/2017 Drewery ............. G05D 7/0641

OTHER PUBLICATIONS

Christensen, Daniel C., David H. Jones, and Alan L. Bondioli. "Retrofit of Sub-Atmospheric Gas Delivery Sources into an Ion Implanter." 2010 18th Biennial University/Government/Industry Micro/Nano Symposium. IEEE, 2010.pp. 1-4 (Year: 2010).*

White, D. C. "Electronic measurement and control of gas flow." Anaesthesia and intensive care 22.4 (1994): pp. 409-414. (Year: 1994).*

Zhuo, Jianli, et al. "Maximizing the lifetime of embedded systems powered by fuel cell-battery hybrids." IEEE Transactions on Very Large Scale Integration (VLSI) Systems 17.1 (2008): pp. 22-32. (Year: 2008).*

Moffitt, Blake, et al. "Design and performance validation of a fuel cell unmanned aerial vehicle." 44th AIAA Aerospace Sciences Meeting and Exhibit. 2006.pp. 1-20 (Year: 2006).*

Anderson, P. L., et al. "A high-speed, rotating-disc metalorganic chemical vapor deposition system for the growth of (Hg, Cd) Te and related alloys." Journal of crystal growth 135.3-4 (1994): pp. 383-400. (Year: 1994).*

* cited by examiner

GAS DELIVERY SYSTEM WITH ELECTRICAL BACKPLANE

CROSS REFERENCE TO RELATED APPLICATIONS

This application claims priority to U.S. Provisional Patent Application No. 62/963,880 filed Jan. 21, 2020, the entirety of which is hereby incorporated herein by reference.

BACKGROUND

Gas delivery systems are used to supply various kinds of gases in industrial applications such as semiconductor manufacturing. In such systems, multiple gas supply channels may flow different gases to be mixed and supplied for various manufacturing processes. A mass flow controller is typically provided for each gas supply channel to adjust the flow rate of the gas.

In some gas delivery systems, the mass flow controllers may all be connected via a network to a central tool which remotely sends commands to the mass flow controllers and requests process data via the network. Each mass flow controller maintains its own control loop with the central tool, synchronized to commands sent via the network from the central tool. Manufacturing processes are fulfilled by sending sequential flow commands and settings from the central tool via the network to the mass flow controllers during the gas delivery process. This approach suffers from the drawback that network latency, bandwidth limitations, and errors often occur in communications between the central tool and mass flow controllers. As a result, limits exist on the speed and amount of data that can be exchanged between the mass flow controllers and the central tool during execution of the manufacturing process. These limits have constrained the functionality of prior gas delivery systems.

SUMMARY

To address these issues, according to one aspect of the present disclosure, a gas delivery system is provided comprising an electrical backplane, a system controller operatively coupled to the electrical backplane, and a plurality of mass flow controllers. Each mass flow controller includes respective mass flow control circuitry operatively coupled to the electrical backplane. The system controller and each mass flow control circuitry are physically mounted on the electrical backplane.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
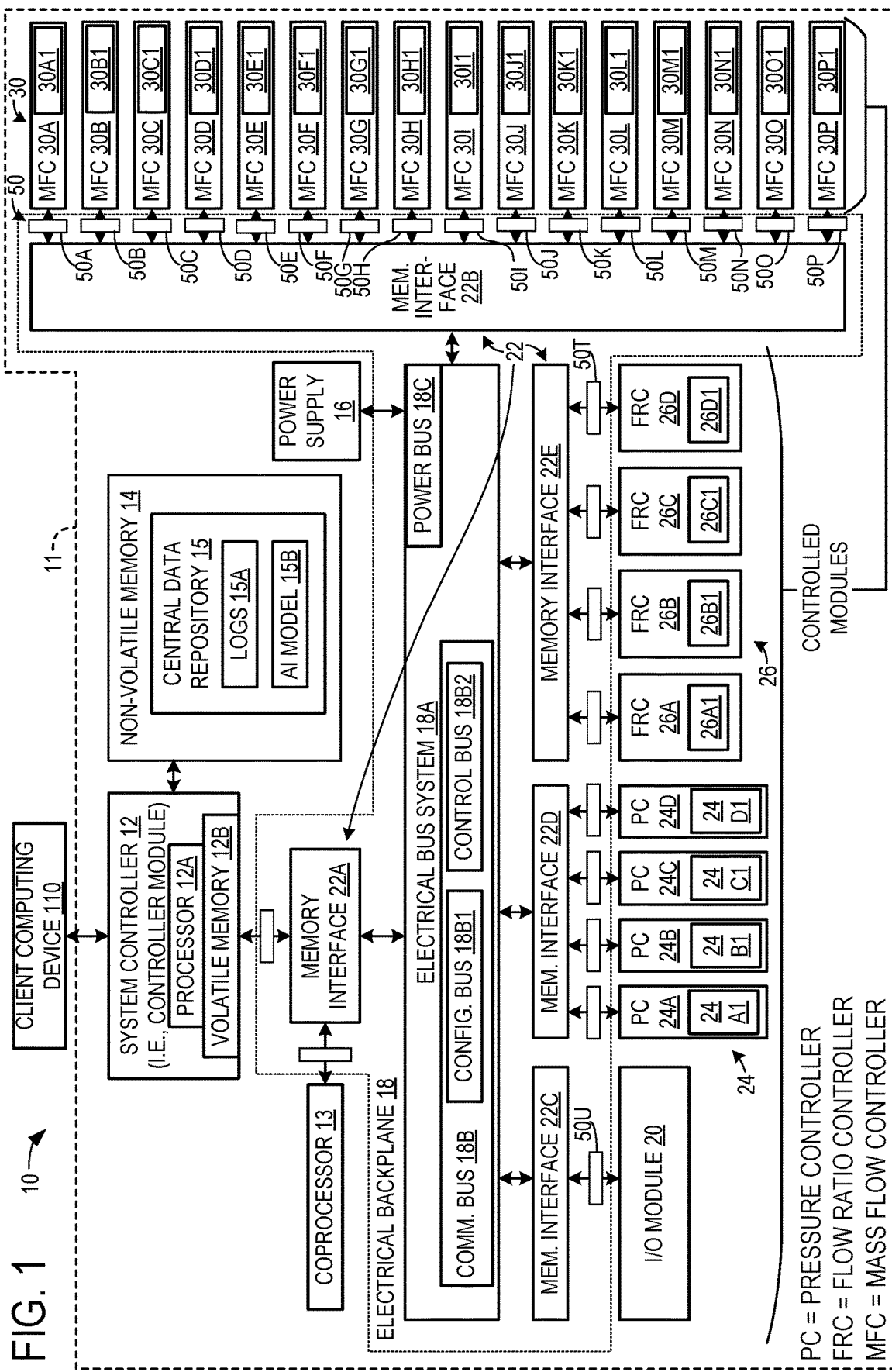
FIG. 1 shows a basic electrical schematic view of a gas delivery system according to one example embodiment.

In view of the above issues, referring to FIG. 1, a centralized gas delivery system 10 is provided comprising a unified high-speed electrical backplane 18 that is operatively coupled to and configured to enable communication among a system controller 12, a plurality of mass flow controllers 30, a plurality of flow ratio controllers 26, a plurality of pressure controllers 24 and an input output module 20, via associated memory interfaces 22 and electrical connectors 50. More specifically, the electrical backplane 18 is operatively coupled to a system controller 12 via a first memory interface 22A, operatively coupled to a plurality of mass flow controllers 30A-30P via a second memory interface 22B, operatively coupled to an input/output module 20 via a third memory interface 22C, operatively coupled to a plurality of pressure controllers 24A-24D via a fourth memory interface 22D, and operatively coupled to a plurality of flow ratio controllers 26A-26D via a fifth memory interface 22E. A client computing device 110 may be operatively coupled to the system controller 12 to send and receive data communications and/or instructions to and from the system controller 12. These data communications may include flow diagnostics information and flow monitoring information of the gas delivery system 10, for example. The gas delivery system 10 may be configured as a gas delivery apparatus which may be enclosed within a housing 11. The system controller 12 may be referred to as a controller module and the mass flow controllers 30, flow ratio controllers 26, pressure controllers 24, and input/output module 20 may be referred to as controlled modules, since they are operated under the control of the system controller 12.

It will be appreciated that while sixteen mass flow controllers are depicted in FIG. 1 as interfacing with the second memory interface 22B, their number is not particularly limited, and may be fewer or greater than sixteen. Further, while four flow ratio controllers 26A-26D are depicted in FIG. 1 as interfacing with the fifth memory interface 22E, their number is not particularly limited, and may be fewer or greater than four. Further, it will be appreciated that while four pressure controllers 24A-24D are depicted in FIG. 1 as interfacing with the fourth memory interface 22D, their number as well is not particularly limited, and may be fewer or greater than four.

The system controller 12 comprises a processor 12A and volatile memory 12B, such as random access memory (RAM). In some implementations, the system controller 12 may be configured as a System on Module (SOM). The processor 12A may be a central processing unit (CPU), application-specific integrated circuit (ASIC), field-programmable gate array (FPGA), or other type of microprocessor, and may be a multi-core processor, for example. The system controller 12 is operatively coupled to non-volatile memory 14 which contains a central data repository 15, which in turn may store data logs 15A and an artificial intelligence (AI) model 15B. The mass flow controllers 30A-30P each include corresponding mass flow control circuitry 30A1-30P1, the flow ratio controllers 26A-26D each include corresponding flow ratio controller circuitry 26A1-26D1, and the pressure controllers 24A-24D each include corresponding pressure control circuitry 24A1-24D1. Like the circuitry of the system controller 12, each mass flow control circuitry 30A1-30P1, flow ratio control circuitry 26A1-26D1, and pressure control circuitry 24A1-24D1 may incorporate a processor and associated volatile and non-volatile memory. The processor of each of these circuitries 30A1-30P1, 26A1-26D1, and 24A1-24D1, may be in the form of a CPU, ASIC, FPGA, or other type of microprocessor, which may be a multi-core processor, and/or be configured as a SOM.

Figure 7:
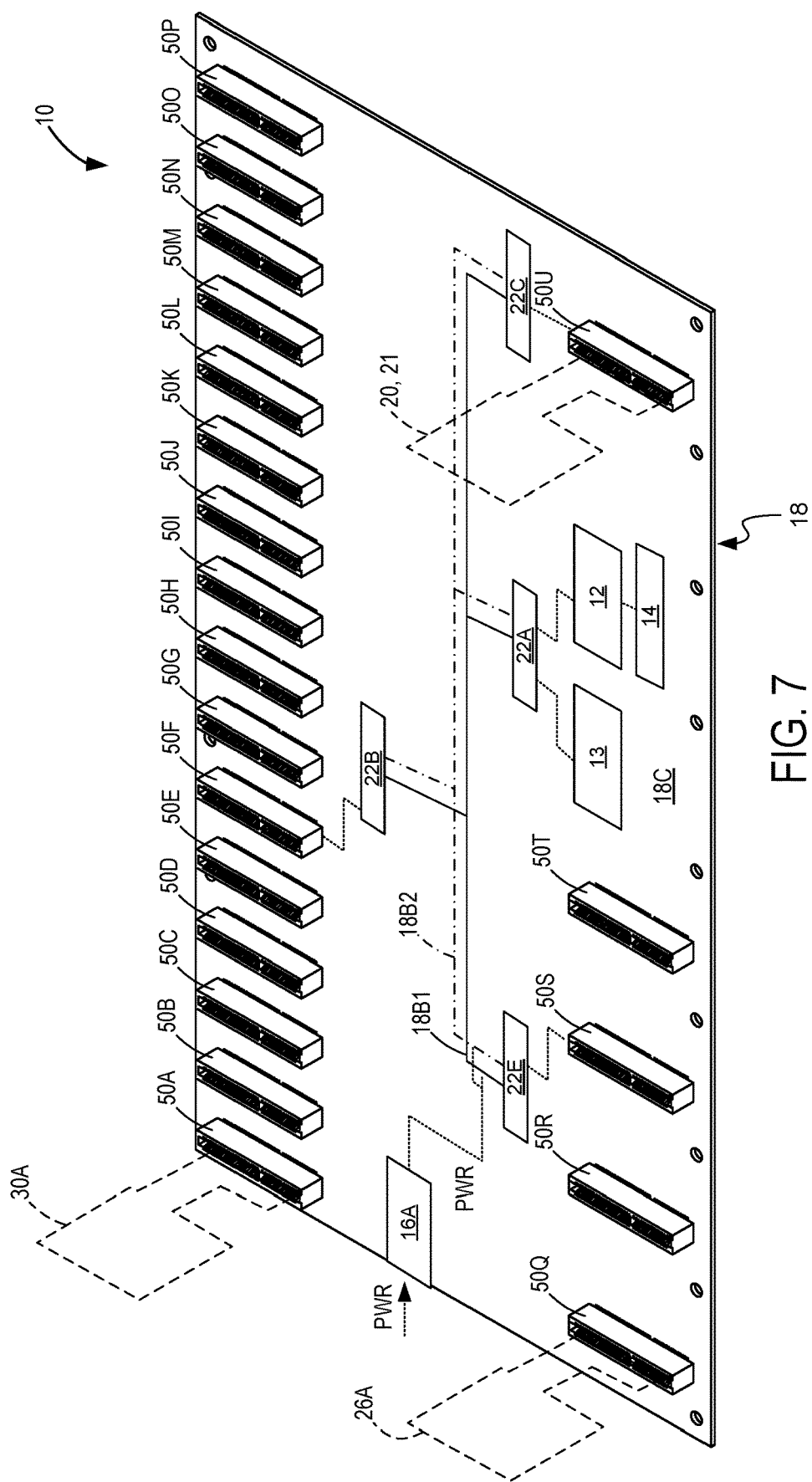
FIG. 7 shows a top perspective view of the electrical backplane of the centralized gas delivery system of FIG. 1, with dashed lines illustrating printed circuit boards of a mass flow controller, flow ratio controller, and input/output module mounted to the electrical backplane.

To reduce the length of the various flow paths and electrical connections in the gas delivery system 10, the system controller 12 circuitry, the mass flow control circuitry 30A1-30P1, flow ratio control circuitry 26A1-26D1, and pressure control circuitry 24A1-24D1 are operatively coupled to the electrical backplane 18 by being electrically and physically mounted on the electrical backplane 18, via corresponding electrical connectors 50A-50U, as more fully illustrated in FIG. 7.

Continuing with FIG. 1, the electrical backplane 18 includes an electrical bus system 18A including a communications bus 18B and a power bus 18C. The electrical backplane may be electrically coupled to a power supply 16 which is configured to supply power via the power bus 18C configured to supply power to all the controlled modules and to the controller module that are physically mounted on the electrical backplane 18, including a plurality of valves, the system controller 12, input/output module 20, pressure controllers 24A-24D, flow ratio controllers 26A-26D, mass flow control circuitry 30A1-30P1, and mass flow controllers 30A-30P. Accordingly, the length of power lines required in the gas delivery system 10 is greatly reduced. In one specific example, the power supply 16 may include a common (i.e., shared) 24 volt DC power supply shared via power bus 18C among all of the controller module and controlled modules in the system. Alternatively or additionally, it will be appreciated that a power supply of different voltage, wattage, or type may be utilized. For example, a 150 volt DC power supply may be additionally provided to power the valves, while the 24 volt power supply is used to power the processing circuitry of the controller and controlled modules.

The electrical backplane 18 forms the communications and power delivery backbone of the gas delivery system 10. Since all communications and control signals, as well as the power supply 16 are embedded on the electrical backplane 18, this allows the system controller 12 real-time access to every sensor and actuator within the gas flow paths. In addition, since the system controller 12 is operatively coupled to the non-volatile memory 14, which is a large high-speed data storage device storing the central data repository 15, it is possible to store all sensor and actuator data in real time for post-process analysis and long-term storage. That is, the system controller 12 and the central data repository 15 are centralized to be co-located in a same physical location, typically in a same housing 11, as the mass flow controllers 30A-30P, flow ratio controllers 26A-26D, and pressure controllers 24A-24D to facilitate data collection from these components over high speed data connections on the unified electrical backplane 18, rather than over higher latency, bandwidth constrained network connections to a remotely located system controller.

The electrical backplane 18 may include a backplane printed circuit board (PCB) with high-speed Low Voltage Differential Signaling (LVDS) interface elements for serial communications and control lines. However, it will be appreciated that the PCB is not particularly limited to LVDS elements, and other standards and interface elements may alternatively be implemented in the PCB to achieve a high-speed electrical backplane 18.

The electrical backplane 18 may contain two independent serial communications subsystems within a communications bus 18B, namely a configuration bus 18B1 configured to route configuration signals between the system controller 12 and each controlled mass flow controller 30A-30P, and a control bus 18B2 configured to route control signals between the system controller 12 and each controlled mass flow controller 30A-30P. Both may operate together, completely independently, and at the same time. All configuration data, module identification data, calibration data, etc., are transferred to each individual module 20, 24A-24D, 26A-26D, 30A-30P via the configuration bus 18B1 during system power up, module configuration, and system configuration phases. During these system power up, module configuration, and system configuration phases, the control bus 18B2 may be in standby mode. Once these phases are completed using the configuration bus 18B1, the control bus 18B2 may transition to an operational mode to allow exchange of control signals between the controller module and the controlled modules. In addition to the previously described functions of the configuration bus 18B1, following start up, during normal operations of the gas delivery system 10, historical data (i.e., log data) is transferred via the configuration bus 18B1 from each controlled module to the system controller 12 for storage in logs 15A, thereby enabling a record of the process to be stored in near real time. During normal operations, the control bus 18B2, on the other hand, transfers control commands from the system controller 12 to each controlled module, and transfers sensor data and other feedback from each module back to the system controller 12, to thereby enable feedback control operations to be performed.

As mentioned above, in the gas delivery system 10, the system controller 12 is designated as the controller module, while the mass flow controllers 30A-30P, flow ratio controllers 26A-26D, pressure controllers 24A-24D, and input/output module 20 are designated as controlled modules. It will be appreciated that the controlled modules may include other modules, including an external bus extension module, a precursor module, an in-situ metrology system, a thermal-based mass flow controller, and a restrictor-less mass flow controller that does not include a restrictor, as described in more detail below. As a fully asynchronous system, the controller module 12, controlled modules, and electrical backplane 18 all operate independently and asynchronously, with no wait states or forced interrupts on local processors. The electrical backplane 18 functions as a full duplex serial bus that handles all communications between the controller module (i.e., system controller 12) and all controlled modules, simultaneously transferring read and write data on each cycle. A coprocessor 13, mounted to the electrical backplane 18 and operatively coupled to the first memory interface 22A, arbitrates or coordinates the exchange of data between the system controller 12 and the controlled modules. In alternative embodiments, the coprocessor 13 may be incorporated into the first memory interface 22A.

Figure 2:
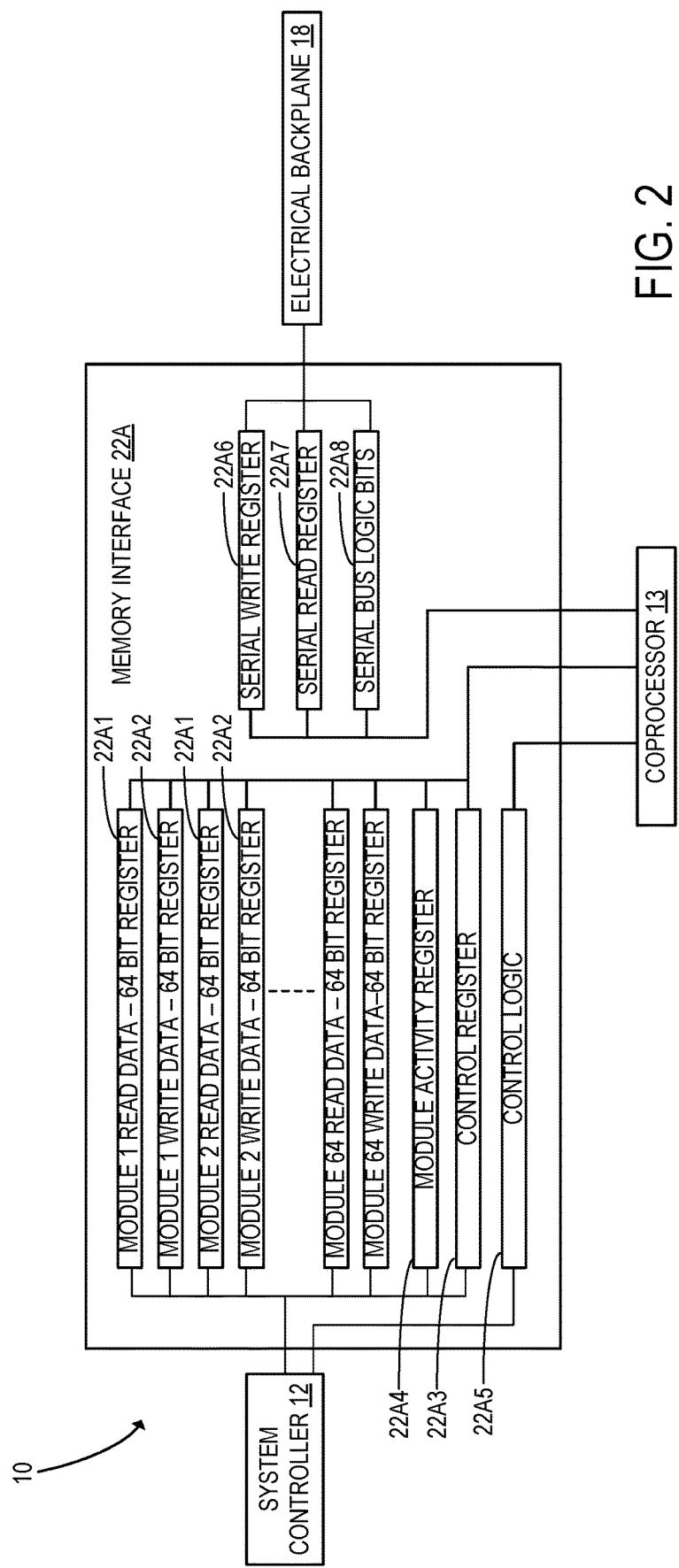
FIG. 2 shows a schematic view of a first memory interface according to the embodiment of FIG. 1.

Referring to FIG. 2, the first memory interface 22A for the system controller 12 may be configured as an FPGA, ASIC, complex programmable logic device (CPLD), or other type of memory control processor which receives serial data from the controlled modules via a serial read register 22A7, and sends serial data to the controlled modules via the serial write register 22A6. The sending and receiving of serial data is performed by executing serial bus logic bits 22A8. For each controlled module, a read data register 22A1 and a write data register 22A2 are provided within the first memory interface 22A for exchanging data between the system controller 12 and the electrical bus system 18A. A control register 22A3 may track the acceptance of transmitted data by each controlled module, as verified by receiving a control signal from the controlled modules. A module activity register 22A4 of the first memory interface 22A may inform the controller module (i.e., system controller 12) of serial bus conditions along with any faults in the sending or receiving of serial data. Control logic 22A5 for performing these memory control functions of the first memory interface 22A is also provided.

The coprocessor 13 may be configured to coordinate asynchronous data communication from the controller module (i.e., system controller 12) to the controlled modules and from the controlled modules to the controller module, including coordinating asynchronous data communications between the system controller 12 and each mass flow control circuitry 30A1-30P1. The coprocessor 13 may coordinate and transfer serial data to and from the various data registers. For example, when serial data is received from a controlled module, the coprocessor 13 may asynchronously deserialize the serialized data streams to generate deserialized data streams, and write the deserialized data into the read data register 22A1 assigned to the controlled module. The deserialized data stream in the read data register 22A1 may then be sent by the coprocessor 13 to the system controller 12 asynchronously. When the system controller 12 sends data to a controlled module, the data may be written into the module write data register 22A2 assigned to the controlled module; the coprocessor 13 may then serialize the data stream in the module write data register 22A2 to generate serialized data streams, and send the serialized data streams to the controlled module, including each mass flow control circuitry 30A1-30P1 via the serial write register 22A6. Thus, the coprocessor 13 may check received serial data integrity and verify the acceptance by the controlled modules of transmitted data via a control signal, transfer the received data into the correct read register, construct the transmit data stream from the write register of the appropriate controlled module, and constantly update the module activity register 22A4 with up-to-date module communication statuses along with any faults. Thus, the first memory interface 22A and the coprocessor 13 may control communication between the controller module and the controlled modules.

Figure 3:
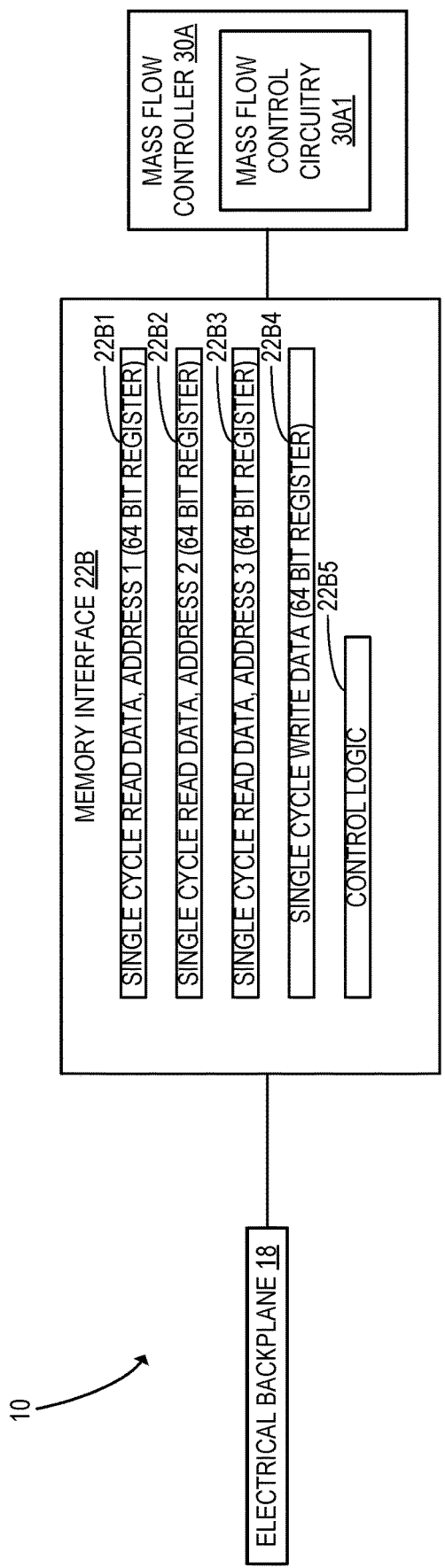
FIG. 3 shows a schematic view of a second memory interface according to the embodiment of FIG. 1.

Referring to FIG. 3, a second memory interface 22B includes read registers 22B1-22B3 and write registers 22B4 for exchanging data between the controlled modules 30A-30P and the electrical bus system 18A. The second memory interface 22B for the mass flow controllers 30A-30P may be configured as a CPLD state machine or other suitable type of memory control processor which executes control logic to receive and forward read data of the data streams sent from the mass flow control circuitry 30A1-30P1 of each individual mass flow controller 30A-30P to the controller module (i.e., system controller 12), as well as receive and forward write data of data streams sent by the controller module to the individual mass flow controllers 30A-30P. The second memory interface 22B is configured to handle the logistic and data transfer between the local processors of the mass flow control circuitry 30A1-30P1 and the electrical backplane 18, using registers 22B1-22B4 under the control of control logic 22B5. Similarly to first memory interface 22A for the controller module, the second memory interface 22B is completely independent and asynchronous to the processors of each of the controlled modules (e.g., no wait states or interrupts). It will be appreciated that the third memory interface 22C, fourth memory interface 22D, and fifth memory interface 22E may be similarly configured as a CPLD state machine to arbitrate data communication between the controller module and the associated controlled modules in a like manner. When data is sent from the system controller 12 via the electrical backplane 18 to the controlled modules, the controlled modules are individually selected, with the address of each controlled module encoded in the data stream. For example, each data stream may include an address of the mass flow control circuitry 30A1-30P1 from which the data stream was sent. The second memory interface 22B receiving the data stream from the system controller 12 then forwards the data stream to the controlled module indicated in the address encoded in the data stream. When sending a data stream to the system controller 12, each of the controlled modules may be configured to encode the address of the controlled module into the data stream, which enables internal registers along with driver outputs for data transmitted back to the controller module. As each data stream received by the first memory interface 22A has an embedded address, it is possible to identify the individual controlled module from which the data stream originated. Accordingly, the system controller 12 obtains knowledge of the address of each controlled module to which data streams are sent. When the address identifies a physical mapping or location associated with a controlled module, the system controller 12 obtains knowledge of the physical mapping or location associated with each controlled module to which data streams are sent.

Figure 4:
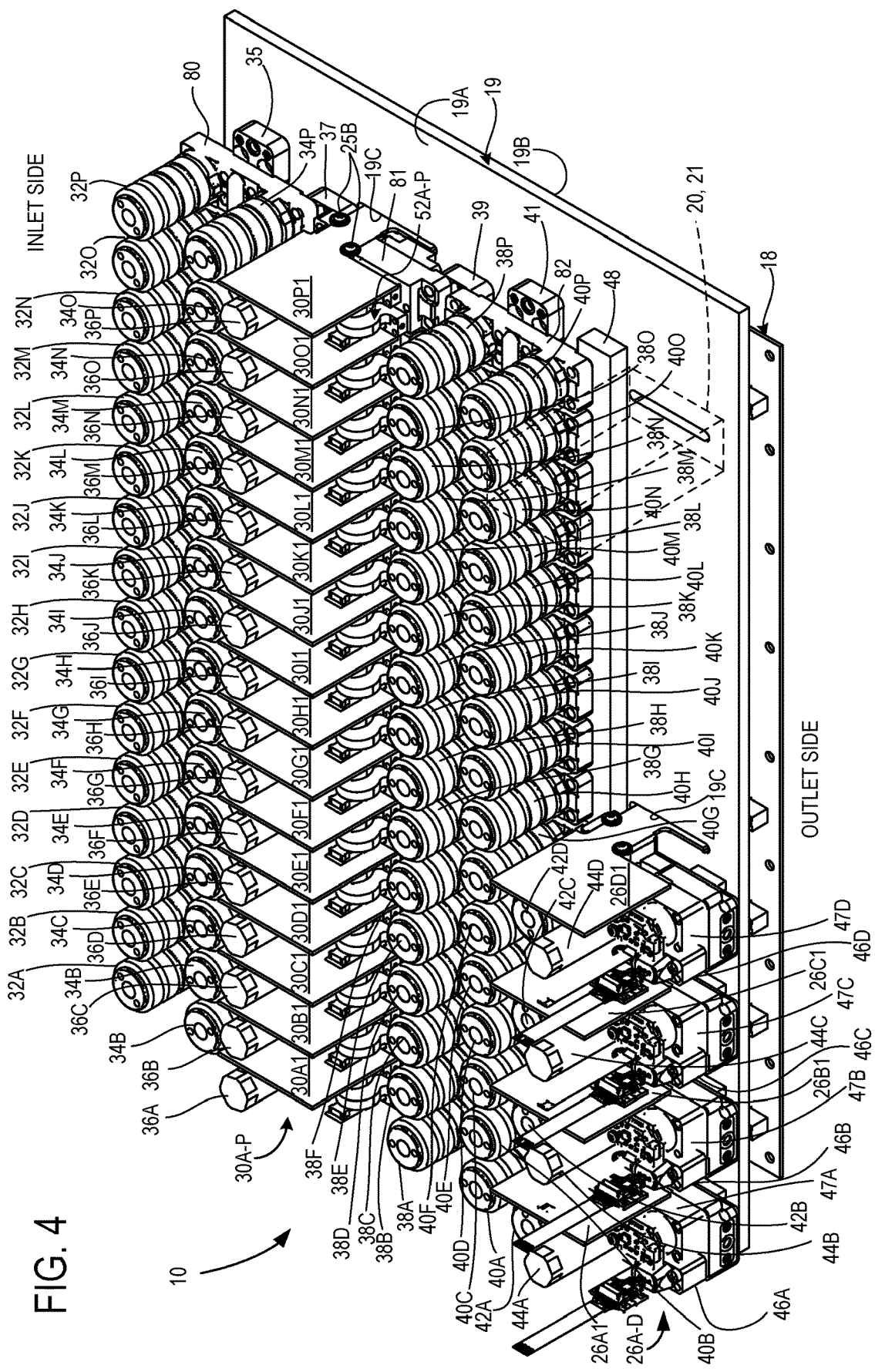
FIG. 4 shows a perspective view of the centralized gas delivery system according to the embodiment of FIG. 1.
Figure 5:
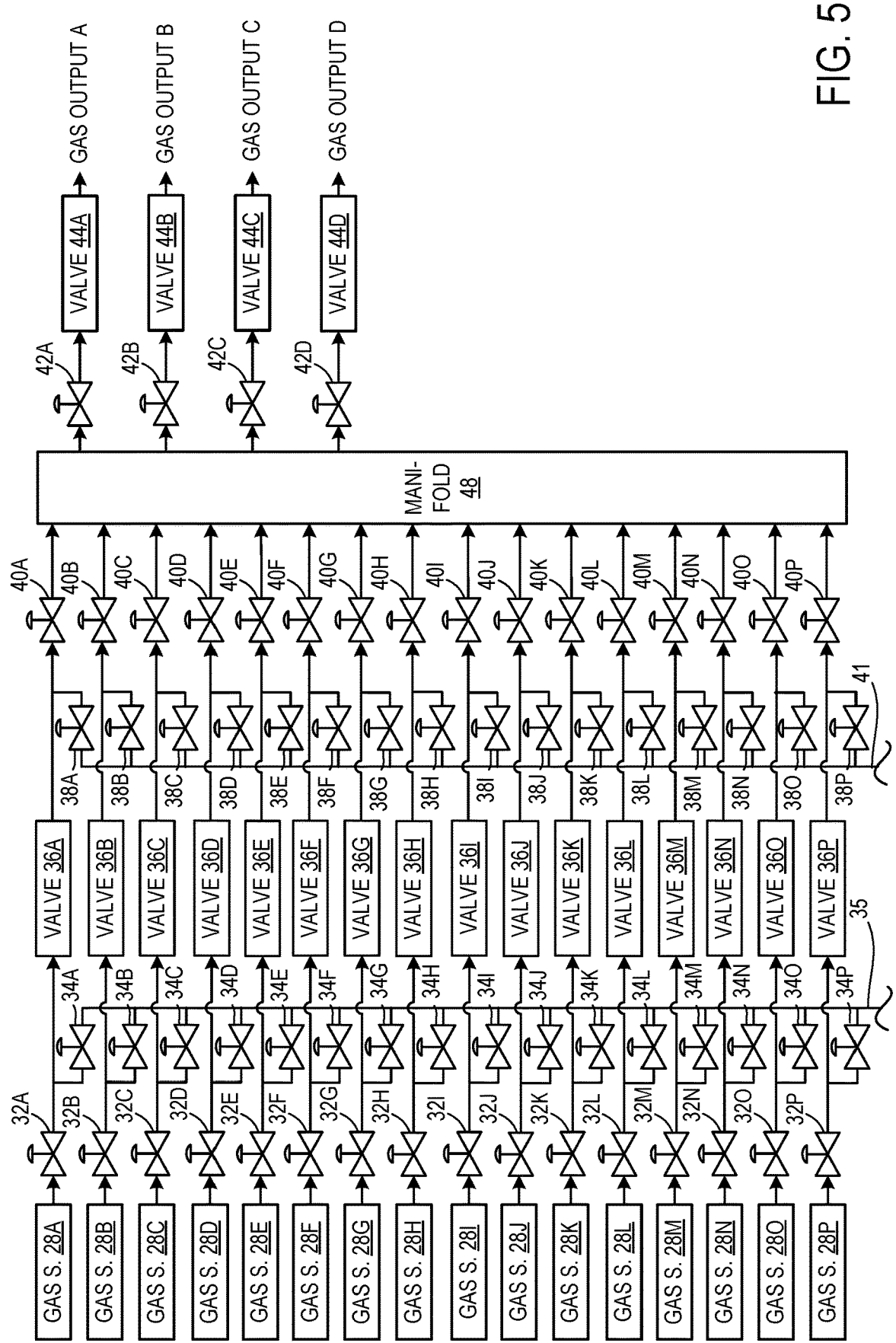
FIG. 5 shows a schematic view of the flow paths and constituent flow control componentry of the centralized gas delivery system according to the embodiment of FIG. 1.

Referring to FIGS. 4 and 5, a layout of the gas delivery system 10 is shown, illustrating the plurality of mass flow controllers 30A-30P and the plurality of flow ratio controllers 26A-26D mounted to a mechanical backplane 19 and to the electrical backplane 18. The mass flow controllers 30A-30P and flow ratio controllers 26A-26D are mounted to and extend upward from a top surface 19A of the mechanical backplane 19. The electrical backplane 18 is mounted to a bottom surface 19B of the mechanical backplane 19 and is spaced apart from the bottom surface 19B by a gap, and is accessed by openings 19C formed in the mechanical backplane through which the mass flow controllers 30A-30P and flow ratio controllers 26A-26D extend to reach electrical connectors 50A-50U (see FIG. 7) on the electrical backplane 18. In other words, a portion of each mass flow controller 30A-30P extends through a respective opening 19C of the plurality of openings to reach the electrical backplane 18. The mass flow controllers 30A-30P and flow ratio controllers 26A-26D are mounted in modular rows of a plurality of elements of mass flow control circuitry 30A1-30P1 and modular rows of a plurality of elements of flow ratio control circuitry 26A1-26D1 mounted on the electrical backplane 18 and mechanical backplane 19. In each row, each mass flow controller includes an associated upstream flow block 80 and an associated downstream flow block 82, which are connected mechanically and fluidically to a mass flow controller flow block 81, with a respective flow path for the row extending from an respective inlet to a respective outlet that leads to the mixing manifold 48. The quantity of the rows within the gas delivery system 10 can be configurable.

Figure 8:
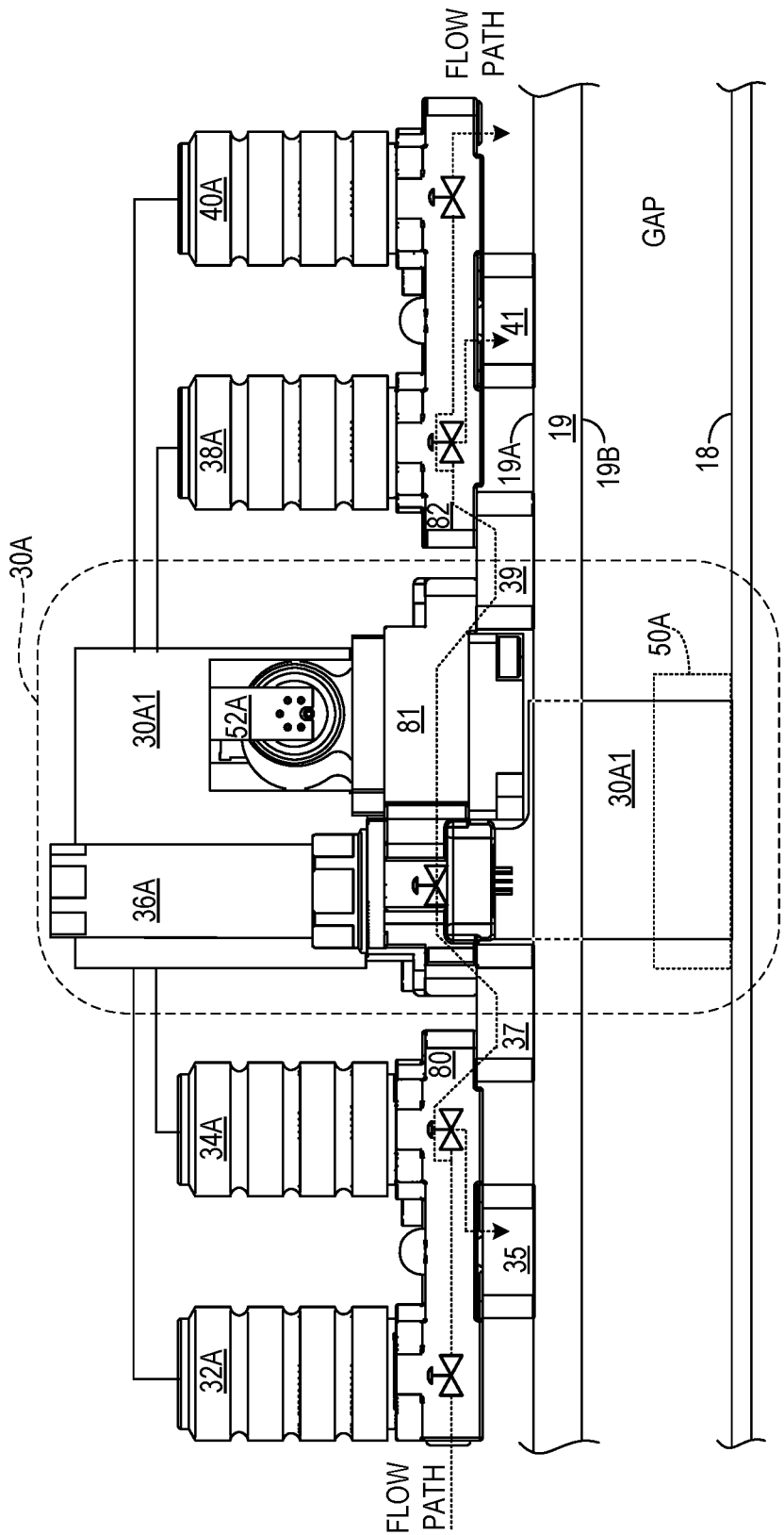
FIG. 8 shows a side view of a typical flow channel used in the gas delivery system of FIG. 1, with dashed lines illustrating a flow path travelling through an upstream flow block with a pair of upstream shutoff valves, a flow control valve, a pair of downstream shutoff valves.

Printed circuit boards of each of the mass flow control circuitry 30A1-30P1 elements and flow ratio control circuitry 26A1-26D1 elements are mechanically fastened via fasteners 25B such as screws to a flow block 81 of the mass flow controllers. The flow block 81 in turn is mounted to a top surface of another flow block 39, which is then mounted to a top surface 19A of the mechanical backplane 19 via fasteners (not shown) such as screws. The printed circuit boards extend from the top surface 19A, through openings 19C in the mechanical backplane 19, to electrical connectors 50A-50U on the electrical backplane 18. Generally, the printed circuit boards terminate on a top surface of the electrical backplane 18 and thus do not extend through the electrical backplane 18. Modular rows conform to standardized dimensions so that each of the flow ratio control circuitry 26A1-26D1 elements is interchangeable and replaceable with another, and each of the mass flow control circuitry 30A1-30P1 elements is interchangeable and replaceable with another. It will be appreciated that in the depicted embodiment, the mass flow controllers 30A-30P are arranged in substantially parallel rows, and the flow ratio controllers 26A-26D are arranged in a different plurality of substantially parallel rows, extending generally from an inlet side to an outlet side of the gas delivery system 10. Each mass flow controller 30A-30P may be provided with a flow control valve 36A-36P, upstream shutoff valves 32A-32P, upstream purge shutoff valves 34A-34P, downstream purge shutoff valves 38A-38P, downstream shutoff valves 40A-40P, and a pressure sensor pair 52A. These components are illustrated in FIG. 8, which shows mass flow controller 30A in a side view. As illustrated, mass flow controller 30A includes mass flow control circuitry 30A1, a flow control valve 36A, and a pressure sensor pair 52A. The flow control valve 36A is mounted in the flow path and configured to control a flow rate of gas flowing through the flow path. It will be appreciated that, during operation, mass flow control circuitry 30A1 reads the pressures from the pressure sensor pair 52A, and controls the flow of gas through the device to a set point by controlling the degree of opening of the flow control valve 36A. It will be appreciated that the mass flow controller 30A is not particularly limited to a pressure sensor pair 52A. In other embodiments, the pressure sensor pair 52A may be replaced with a single pressure sensor, for example.

Returning to FIGS. 4 and 5, each flow ratio control circuitry element 26A1-26D1 may be provided with a flow ratio control valve 44A-44D, a flow ratio shutoff valve 42A-42D, and flow ratio pressure sensors 46A-46D, 47A-47D. A plurality of gas sources 28A-28P may be externally connected to the upstream shutoff valves 32A-32P, on an inlet side of the gas delivery system 10. During the gas delivery process, the gas introduced from the first gas source 28A may flow through the open first upstream shutoff valve 32A, the first flow control valve 36A, the first downstream shutoff valve 40A, and then into a mixing manifold 48 to mix with other gases from other gas sources that have also flowed through their respective flow paths and flow control valves into the mixing manifold 48. The mixing manifold 48 is configured to receive gas from each mass flow controller 30A-30P and mix the gases. The mixed gases in the mixing manifold 48 are then guided by the mixing manifold 48 to respective inlets of the flow ratio controllers 26A-26D to flow through the flow ratio shutoff valves 42A-42D and the flow ratio control valves 44A-44D to be output as gas outputs A-D on the outlet side of the gas delivery system 10.

Each flow path between the upstream shutoff valve 32A-32P and the flow control valve 36A-36P may have a branching flow path that leads to an upstream purge shutoff valve 34A-34P. When opened, the upstream purge shutoff valve 34A-34P allows fluid to flow from the upstream shutoff valve 32A-32P into the upstream purge manifold 35 to eject fluid out of the gas delivery system 10. When closed, the upstream purge shutoff valve 34A-34P allows the fluid to flow without diversions from the gas source 28A-28P to the flow control valve 36A-36P. Accordingly, by controlling individual upstream shutoff valves 32A-32P and upstream purge shutoff valves 34A-34P, flow paths in individual modular rows may be targeted to purge fluid out of the gas delivery system 10 in a compartmentalized manner. In other words, the system controller 12 is configured to control each shutoff valve 34A-34P so as to control the purging of gas in each modular row on the mechanical backplane 19. It will be appreciated that valves 32, 34, 38, and 40 can be used to evacuate or isolate certain portions of the gas delivery system 10 when the mass flow controller 30A-30P requires replacement.

The upstream shutoff valve 32A-32P and the upstream purge shutoff valve 34A-34P may be controlled by the mass flow controller 30A-30P to create a vacuum in the flow path between the upstream shutoff valve 32A-32P and the flow control valve 36A-36P. For example, when a vacuum is desired between the first upstream shutoff valve 32A and the first flow control valve 36A, the first upstream shutoff valve 32A and the first flow control valve 36A may be closed completely and the first upstream purge shutoff valve 34A opened to allow the gas in the flow path between the first upstream shutoff valve 32A and the first flow control valve 36A to be purged into the upstream purge manifold 35 and ejected out of the gas delivery system 10, effectively creating a vacuum in the flow path between the first upstream shutoff valve 32A and the first flow control valve 36A. Alternatively or additionally, the first upstream shutoff valve 32A and the first flow control valve 36A may be closed completely and the first upstream purge shutoff valve 34A opened to allow the gas in the flow path between the first upstream shutoff valve 32A and the first flow control valve 36A to be purged into the upstream purge manifold 35 and new gas introduced into the gas delivery system 10, effectively creating pressure in the flow path between the first upstream shutoff valve 32A and the first flow control valve 36A. It will be appreciated that the purge manifolds 35 and 41 can be connected to either a purge system or a vacuum system, and downstream shutoff valves 40A-40P can be used to control or stop the purging or vacuuming process.

Referring to FIGS. 1 and 4, as briefly discussed above, two backplanes are illustrated: the electrical backplane 18 and the mechanical backplane 19 stacked on the electrical backplane 18 with a gap formed therebetween. When the gas delivery system 10 is configured as a gas delivery apparatus, the electrical backplane 18 and the mechanical backplane 19 are enclosed within a housing 11 of the gas delivery apparatus. On the electrical backplane 18, the system controller 12 and the controlled modules 20, 24A-24D, 26A-26D, 30A-30P are physically mounted via electrical connectors 50A-50U, which contain slots configured to receive the printed circuit boards of the controlled modules. On the mechanical backplane 19, a plurality of mass flow controllers 30A-30P are physically mounted to the flow blocks 81. Flow paths pass through the flow blocks 81 of the mass flow controllers 30A-30P and through a plurality of valves (upstream shutoff valves 32A-32P, upstream purge shutoff valves 34A-34P, flow control valves 36A-36P, downstream purge shutoff valves 38A-38P, downstream shutoff valves 40A-40P) operatively coupled to the plurality of mass flow control circuitry 30A1-30P1 elements and positioned in the flow paths. The respective flow paths fluidically connect the plurality of valves (upstream shutoff valves 32A-32P, upstream purge shutoff valves 34A-34P, flow control valves 36A-36P, downstream purge shutoff valves 38A-38P, downstream shutoff valves 40A-40P) to the plurality of mass flow controllers 30A-30P. Also physically mounted on the mechanical backplane 19 are a plurality of valves (flow ratio shutoff valves 42A-42D and flow ratio control valves 44A-44D) operatively coupled to the flow ratio control circuitry 26A1-26D1 as well as flow paths fluidically connecting the plurality of valves (flow ratio shutoff valves 42A-42D and flow ratio control valves 44A-44D) to the plurality of flow ratio controllers 26A-26D. Thus, the plurality of valves and flow paths are arranged in modular rows on the mechanical backplane 19.

Although input/output module 20 is shown mounted in the bottom right corner of the gas delivery system 10 in FIGS. 4 and 7, it will be appreciated that in addition or as an alternative a rate-of-change flow measurement device 21 may be installed in the same location, or in the vicinity thereof, downstream of the mass flow controllers 30 and mixing manifold 48. The rate-of-change flow measurement device 21 may be configured to perform a rate-of-rise (ROR) measurement of the mass flow controllers 30 to determine a flow rate or flow rate profile of the mass flow controllers 30, or perform a rate-of-fall (ROF) measurement of the flow ratio controllers 26 to determine a flow rate or flow rate profile of the flow ratio controllers 26. Further, while both are illustrated in FIGS. 4 and 7 as being alternatively positionable in the same location, it will appreciated that both the input/output module 20 and one or more rate of change measurement devices 21 may be installed as controlled modules downstream of the mixing manifold 48, in the space provided next to the flow ratio controllers, for example. Further, other components may be mounted in this location, including an external bus extension, a precursor module, an in-situ metrology system, a thermal-based mass flow controller, and a restrictor-less mass flow controller that does not include a restrictor. The precursor module may be a gas line that is configured to carry precursor gas. The thermal-based mass flow controller may be configured with temperature sensors instead of pressure sensors to control the flow of fluid through the mass flow controller. The restrictor-less mass flow controller may be configured to model the dynamics of the fluid flowing through the mass flow controller via a regression model or trained machine learning model to accurately estimate the flow rate. The flow rate may be estimated based on inputs from at least two pressure sensors, a temperature sensor, and a valve position sensor. The restrictor-less mass flow controller may be configured to control the position of a control valve based on the estimated flow rate, and does not include a restrictor. An example of a restrictor-less mass flow controller that may be utilized is described in U.S. Pat. App. Ser. No. 62/953,803, the entire disclosure of which is herein incorporated by reference. The in-situ metrology system may receive feedback from a downstream process chamber regarding a metrological process taking place therein on a workpiece under manufacture, and vary a characteristic (e.g., temperature, pressure, flow rate, or duration of flow) of the flow of gas through the gas delivery system based upon the feedback. For example, the feedback may be a signal indicating a thickness of material deposited on a wafer in a semiconductor processing chamber, which has been measured in the chamber by an optical emitter and detector.

Continuing with FIGS. 1 and 4, each flow path between the downstream shutoff valve 40A-40P and the corresponding flow control valve 36A-36P may have a branching flow path that leads to a downstream purge shutoff valve 38A-38P. When opened, the downstream purge shutoff valve 38A-38P allows fluid to flow from the respective flow control valve 36A-36P into the downstream purge manifold 41 to eject fluid out of the gas delivery system 10. When closed, the downstream purge shutoff valve 38A-38P allows the fluid to flow without diversions from the flow control valve 36A-36P to the mixing manifold 48.

The downstream shutoff valve 40A-40P and the downstream purge shutoff valve 38A-38P may be controlled by the mass flow controller 30A-30P to create a vacuum in the flow path between the flow control valve 36A-36P and the downstream shutoff valve 40A-40P. For example, when a vacuum is desired between the first flow control valve 36A and the first downstream shutoff valve 40A, the first flow control valve 36A and the downstream shutoff valve 40A may be closed completely and the first downstream purge shutoff valve 38A opened to allow the gas in the flow path between the first flow control valve 36A and the first downstream shutoff valve 40A to be purged into the downstream purge manifold 41 and ejected out of the gas delivery system 10, effectively creating a vacuum in the flow path between the first flow control valve 36A and the downstream shutoff valve 40A. Alternatively or additionally, the first flow control valve 36A and the downstream shutoff valve 40A may be closed completely and the first downstream purge shutoff valve 38A opened to allow the gas in the flow path between the first flow control valve 36A and the first downstream shutoff valve 40A to be purged into the downstream purge manifold 41 and new gas introduced into the gas delivery system 10, effectively creating pressure in the flow path between the first flow control valve 36A and the first downstream shutoff valve 40A. The vacuum source may be a vacuum pump coupled to the outlet of the purge manifold 41. Alternatively as discussed elsewhere herein, the purge may occur by flowing purge gas (under pressure at the gas source, vacuum at the purge manifolds, or a combination thereof) into an inlet of the upstream flow block 80 and opening the upstream and downstream shutoff valves and the upstream and downstream purge shutoff valves to allow flow of the purge gas through the flow blocks 80-82 and out the purge manifolds 35, 41. Accordingly, by controlling individual downstream shutoff valves 40A-40P and downstream purge shutoff valves 38A-38P, flow paths in individual modular rows may be targeted to purge fluid out of the gas delivery system 10 in a compartmentalized manner. In other words, the system controller 12 is configured to control each shutoff valve 38A-38P so as to control the purging of gas in each modular row on the mechanical backplane 19.

Figure 6:
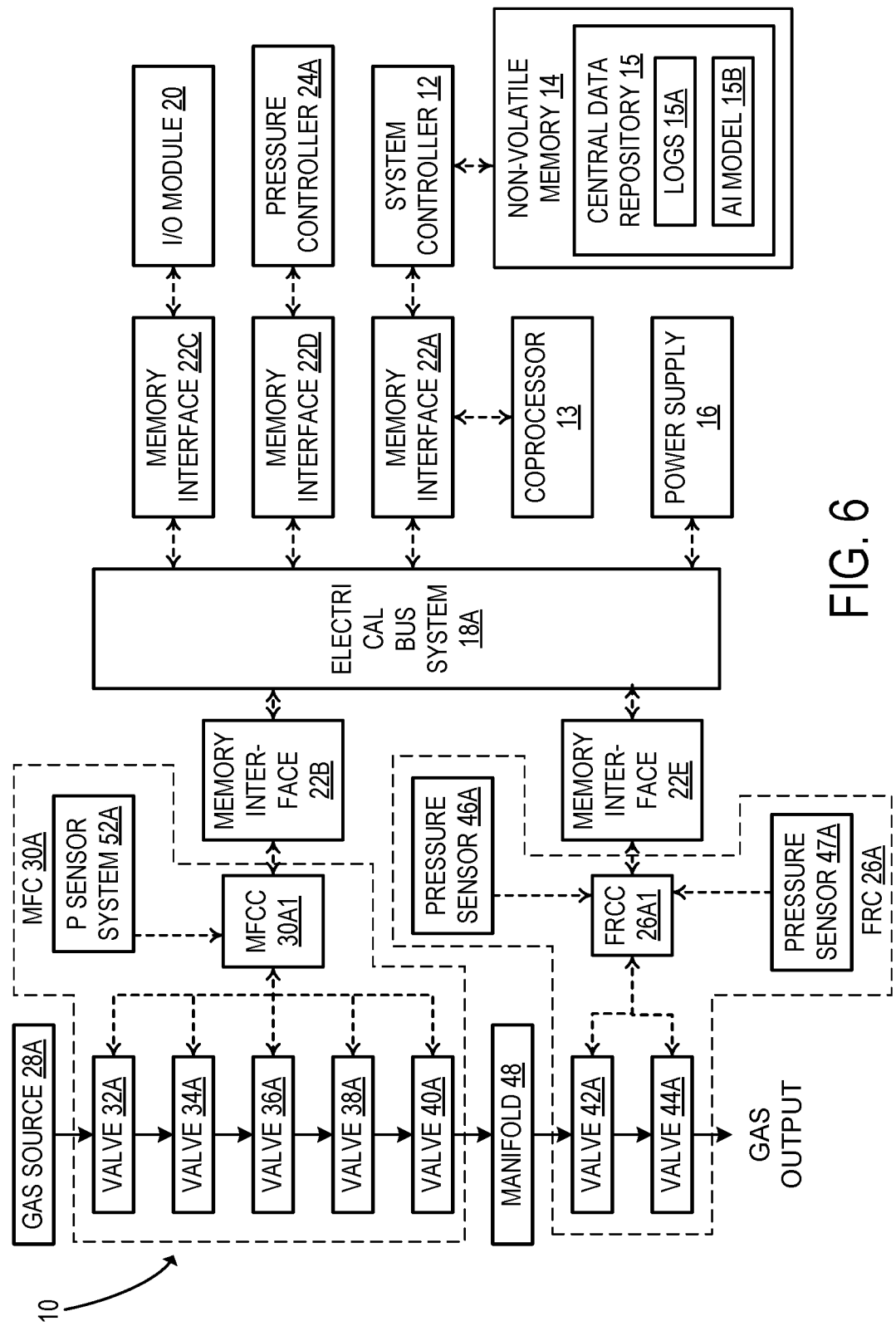
FIG. 6 shows a schematic view illustrating the flows of data and control signals between a system controller, mass flow controller, and flow ratio controller, via an electrical bus system of the gas delivery system of FIG. 1.

FIG. 6 is an exemplary schematic diagram depicting the flows of data and control signals with respect to the first mass flow control circuitry 30A1 and the first flow ratio control circuitry 26A1. For the sake of brevity, the flows of data and control signals with respect to the other controlled modules are not depicted in this schematic diagram.

Referring to FIG. 6, an example of the asynchronous flow of data signals from the pressure sensor pair 52A will be described. The pressure sensor pair 52A senses a pressure in the flow path corresponding to the first mass flow controller 30A, and sends a pressure signal to the first mass flow control circuitry 30A1. The first mass flow control circuitry 30A1 then embeds an address corresponding to the first mass flow control circuitry 30A1 and the pressure sensor pair 52A into a data stream, and sends the data stream containing the embedded address and the pressure signal to the second memory interface 22B. The second memory interface 22B directs the data stream to the electrical backplane 18, and the electrical backplane 18 sends the data stream to the first memory interface 22A. The coprocessor 13 deserializes the data stream and stores the data stream into a read data register of the first memory interface 22A corresponding to the first mass flow control circuitry 30A1. This data stream transmission from the first mass flow control circuitry 30A1 to the first memory interface 22A may be triggered by a request by the coprocessor 13. The system controller 12 then accesses the read data register of the first memory interface 22A corresponding to the first mass flow control circuitry 30A1, and the system controller 12 recognizes the pressure signals as originating from pressure sensor pair 52A corresponding to the first mass flow controller 30A. This data may then be stored in a data log 15A in the central data repository 15 of the non-volatile memory 14, so that the data in the data log 15A will be available for later analysis via an AI model 15B, for example. It will be appreciated that the pressure signals from the pressure sensors 46A and 47A of the first flow ratio controller 26A are similarly handled by the flow ratio control circuitry 26A1, the fifth memory interface 22E, electrical backplane 18, the first memory interface 22A, and the system controller 12 to store the pressure signals of the pressure sensors 46A and 47A into the data logs 15A. Accordingly, during an operating process, the system controller 12 may collect valve position information and sensor information from at least a plurality of the sensors and valves that are operatively coupled to the plurality of mass flow controllers 30A-30P and flow ratio controllers 26A-26D, and store the valve position information and sensor information into the data logs 15A stored in the non-volatile memory 14. After the operating process, the valve position information and sensor information may be uploaded to a remote computer in batches, for example.

The system controller 12 is not particularly limited to the collection and storage of information, and the system controller 12 is also configured to perform calculations based on the stored valve position and sensor information. In this example, the system controller 12 is also configured to calculate flow and control values based on the valve position and sensor information from the active mass flow controllers and active flow ratio controllers, in real time during the control operations. For example, when the system controller 12 acquires pressure information, temperature information, and valve position information of a first flow control valve 36A from the first mass flow controller 30A, the system controller 12 may calculate the flow and determine a new appropriate valve position accordingly, then store the new valve position into the first memory interface 22A. The coprocessor 13 may send the new valve position back to the first mass flow controller 30A, which then adjusts the first flow control valve 36A to the new valve position. In other words, the system controller 12 may handle data and control calculations for the gas delivery system 10 during real time operation.

As an example of a practical application of the AI model 15B, the system controller 12 may be further configured to execute the AI model 15B stored in the non-volatile memory 14 to, at training time, train the AI model 15B on the sensor information from the plurality of sensors and on the valve position information from the plurality of valves during a golden manufacturing process. At run-time, the system controller 12 may subsequently execute an AI model feedback module to monitor variance in the performance of the manufacturing process relative to a golden manufacturing process or conduct feedback training on the AI model 15B based on the sensor information and the valve position information, and determine the variance in performance of a run-time manufacturing process relative to the golden manufacturing process using the trained AI model 15B.

As depicted in FIG. 6, in this example, the first mass flow control circuitry 30A1 is operatively coupled to the shutoff valves 32A, 34A, 38A, and 40A as well as the flow control valve 36A. The first mass flow control circuitry 30A1 may send control signals to each of the valves 32A, 34A, 36A, 38A, 40A to control an opening position of each valve 32A, 34A, 36A, 38A, 40A. In turn, each of the valves 32A, 34A, 36A, 38A, 40A may send data signals to the first mass flow control circuitry 30A1 indicating an opening position of each valve 32A, 34A, 36A, 38A, 40A. Likewise, the first flow ratio control circuitry 26A1 is operatively coupled to the flow ratio shutoff valve 42A and the flow ratio control valve 44A. The first flow ratio control circuitry 26A1 may send control signals to each of the valves 42A, 44A to control an opening position of each valve 42A, 44A. In turn, each of the valves 42A, 44A may send data signals to the first flow ratio control circuitry 26A1 indicating an opening position of each valve 42A, 44A. For shutoff valves 32A, 34A, 38A, 40A, and 42A, the opening position may be an opening state that is either on or off. For control valves 36A and 44A, the opening position may be a selectively variable opening position out of a plurality of possible opening positions, such as a percentage or degree of opening, and may be on a linear scale.

For example, when the system controller 12 closes the first upstream shutoff valve 32A in an asynchronous process, the system controller 12 sends a data stream embedded with an address of the first upstream shutoff valve 32A and the first mass flow control circuitry 30A1. The data stream enters the first memory interface 22A to a write data register correspond to the first mass flow control circuitry 30A1. The coprocessor 13 then serializes the data stream and sends it into the electrical backplane 18, where the data stream is directed to the second memory interface 22B. The second memory interface 22B reads the address embedded within the data stream, and forwards the data stream to the first mass flow control circuitry 30A1. The first mass flow control circuitry 30A1 then sends a control signal to the first upstream shutoff valve 32A and controls an opening of the first upstream shutoff valve 32A in accordance with the instructions from the system controller 12 in the data stream. It will be appreciated that the system controller 12 may control the other valves in the gas delivery system 10 in a like manner that is asynchronous.

Turning to FIG. 7, a perspective view of the electrical backplane 18 is illustrated. The electrical backplane 18 includes a printed circuit board provided with a plurality of backplane interfaces, each backplane interface configured to mount a controlled module 20, 24A-24D, 26A-26D, 30A-30P. The backplane interfaces are in the form of electrical connectors 50A-50U. In one example, the electrical connections are board-to-board right angle printed circuit board receptacle, such as PCIe slots, configured to receive printed circuit boards of the controlled modules. In this example, each mass flow control circuitry 30A1-30P1 includes a respective local printed circuit board that is physically mounted on the electrical backplane 18 via a board-to-board electrical connection between the local printed circuit board and the backplane printed circuit board. System controller 12, coprocessor 13, non-volatile memory 14, and memory interfaces 22A-22E are illustrated as chipsets directly mounted to a top of the electrical backplane 18 and connected by electric traces of the configuration bus 18B1 and control bus 18B2, and connected to a power supply bus 16A. However, the system controller 12, coprocessor 13, and non-volatile memory 14 may alternatively be mounted on a back side of the electrical backplane 18, or may be mounted to a separate printed circuit board and connected to the electrical backplane via a slot receptacle, such as a PCIe slot. Configuring the electrical backplane 18 as a single circuit board achieves centralization of the data processing and control of hardware by the system controller, reducing the bandwidth limitations and latency that are associated with controllers that are separated by a distance from the hardware that they control and communicate over a computer network. The mounting of an element to the electrical connectors 50A-50U may involve plugging the element into a slot in the electrical connector 50A-50U, such as a PCIe receptacle as discussed above. The power supply bus 16A may be configured to supply power to the plurality of mass flow controllers 30A-30P, flow ratio controllers 26A-26D, system controller 12, and the plurality of valves (upstream shutoff valves 32A-32P, upstream purge shutoff valves 34A-34P, flow control valves 36A-36P, downstream purge shutoff valves 38A-38P, downstream shutoff valves 40A-40P, flow ratio shutoff valves 42A-42D, and flow ratio control valves 44A-44D).

FIG. 8 shows a side view of the first mass flow controller 30A and its corresponding first upstream flow shutoff valve 32A, first upstream purge shutoff valve 34A, downstream purge shutoff valve 38A, downstream shutoff valve 40A, and the first flow control valve 36A according to the embodiment of FIG. 1. It will be appreciated that this standardized valve arrangement and configuration of the mass flow control circuitry is representative of the arrangement of the hardware corresponding to the rest of the mass flow control circuitry 30B-30P according to the embodiment of FIG. 1. The standardization of the hardware arrangement allows for mass flow control circuitry to be easily installed or uninstalled from the electrical backplane according to user preferences. The valves and controllers are provided in a modular, orderly arrangement, increasing the ease of management and maintenance of the gas delivery system 10. In each row, each mass flow controller 30A-30P has an associated upstream flow block 80 and an associated downstream flow block 82. The first upstream flow shutoff valve 32A and the first upstream purge shutoff valve 34A are provided adjacent to the upstream purge manifold 35 in an upstream flow block 80, while the downstream purge shutoff valve 38A and the downstream shutoff valve 40A are provided adjacent to the downstream purge manifold 41 in a downstream flow block 82. The mass flow controller 30A is provided in close proximity with the first flow control valve 36A, the pressure sensor pair 52A, and the shutoff valves 32A, 34A, 38A, and 40A. These close distances and adjacent placements achieve a compact arrangement of the flow elements and circuitry of the gas delivery system 10. Moreover, the upstream flow block 80 and the downstream flow block 82 have modular, standardized shapes, mounts, and connectors to be compatible and interoperable on the mechanical backplane 19. Accordingly, flow blocks can be freely interchanged and replaced with different valves, flow paths, and sensors accommodated in different flow blocks, as long as the flow blocks conform to standards that allow them to interface with the mechanical backplane 19 and interoperate with the rest of the components of the gas delivery system 10.

Figure 9:
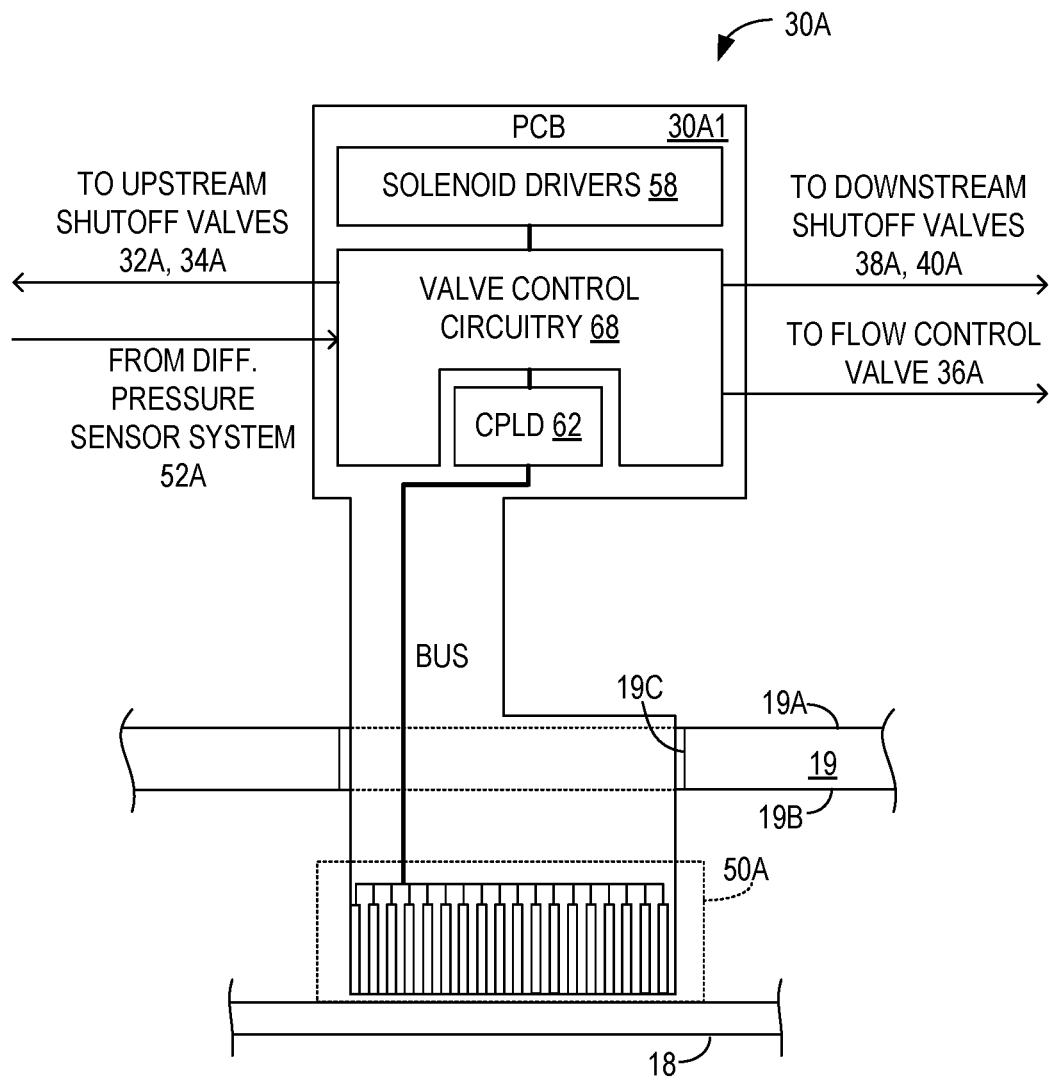
FIG. 9 shows a schematic side view of a printed circuit board of a mass flow controller of the gas delivery system of FIG. 1, extending through a mechanical backplane to physically and electrically connect with an electrical backplane.

FIG. 9 illustrates the mass flow control circuitry 30A1 of exemplary mass flow controller 30A of the gas delivery system 10. The mass flow control circuitry 30A1 includes a printed circuit board, which has an upper half that extends above the top surface 19A of the mechanical backplane 19, an intermediate portion that extends through an opening 19C in the mechanical backplane 19, and a lower portion that extends below the bottom surface 19B of the mechanical backplane 19 into the electrical connector 50A on the electrical backplane 18. Solenoid drivers 58, which may include electrical or pneumatic solenoid drivers, are included for example in non-volatile memory. Valve control circuitry 68 is provided that can read the drivers and read the pressure signals detected by the pressure sensor pair 52A, and output drive signals to the flow control valve 36A as well as to upstream shutoff valve 32A, upstream purge shutoff valve 34A, downstream purge shutoff valve 38A, and downstream shutoff valve 40A. CPLD circuitry 62 is provided, which may be configured as a memory interface, to enable valve control circuitry 68 to communicate with the system controller 12 via local bus and pins on the PCB of the mass flow controller, the electrical connector 50A, and the communications bus 18B of the electrical backplane 18. It will be appreciated that the flow ratio controllers 26A-26D and pressure controllers 24A-24D may be configured similarly to the mass flow controller 30A.

It will be appreciated that the electrical backplane 18 is not particularly limited to being operatively coupled to the particular arrangement of flow blocks and controlled modules depicted in FIG. 4, and may alternatively be operatively coupled to other arrangements of flow blocks and controlled modules to achieve similar potential advantages of centralized data acquisition and control.

Although the second memory interface 22B is depicted as a single interface connecting to the plurality of mass flow controllers 30A-30P in the Figures, it will be appreciated that the second memory interface 22B may alternatively be embodied as a plurality of interfaces connecting to the plurality of mass flow controllers 30A-30P. In one alternative embodiment, the second memory interface 22B may comprise a plurality of interfaces, each interface connecting to one mass flow controller. Although the fourth memory interface 22D is depicted as a single interface connecting to the plurality of pressure controllers in the Figures, it will be appreciated that the fourth memory interface 22D may alternatively be embodied as a plurality of interfaces connecting to the plurality of pressure controllers. In one alternative embodiment, the fourth memory interface 22D may comprise a plurality of interfaces, each interface connecting to one pressure controller. Although the fifth memory interface 22E is depicted as a single interface connecting to the plurality of flow ratio controllers in the Figures, it will be appreciated that the fifth memory interface 22E may alternatively be embodied as a plurality of interfaces connecting to the plurality of flow ratio controllers. In one alternative embodiment, the fifth memory interface 22E may comprise a plurality of interfaces, each interface connecting to one flow ratio controller.

Figure 10A:
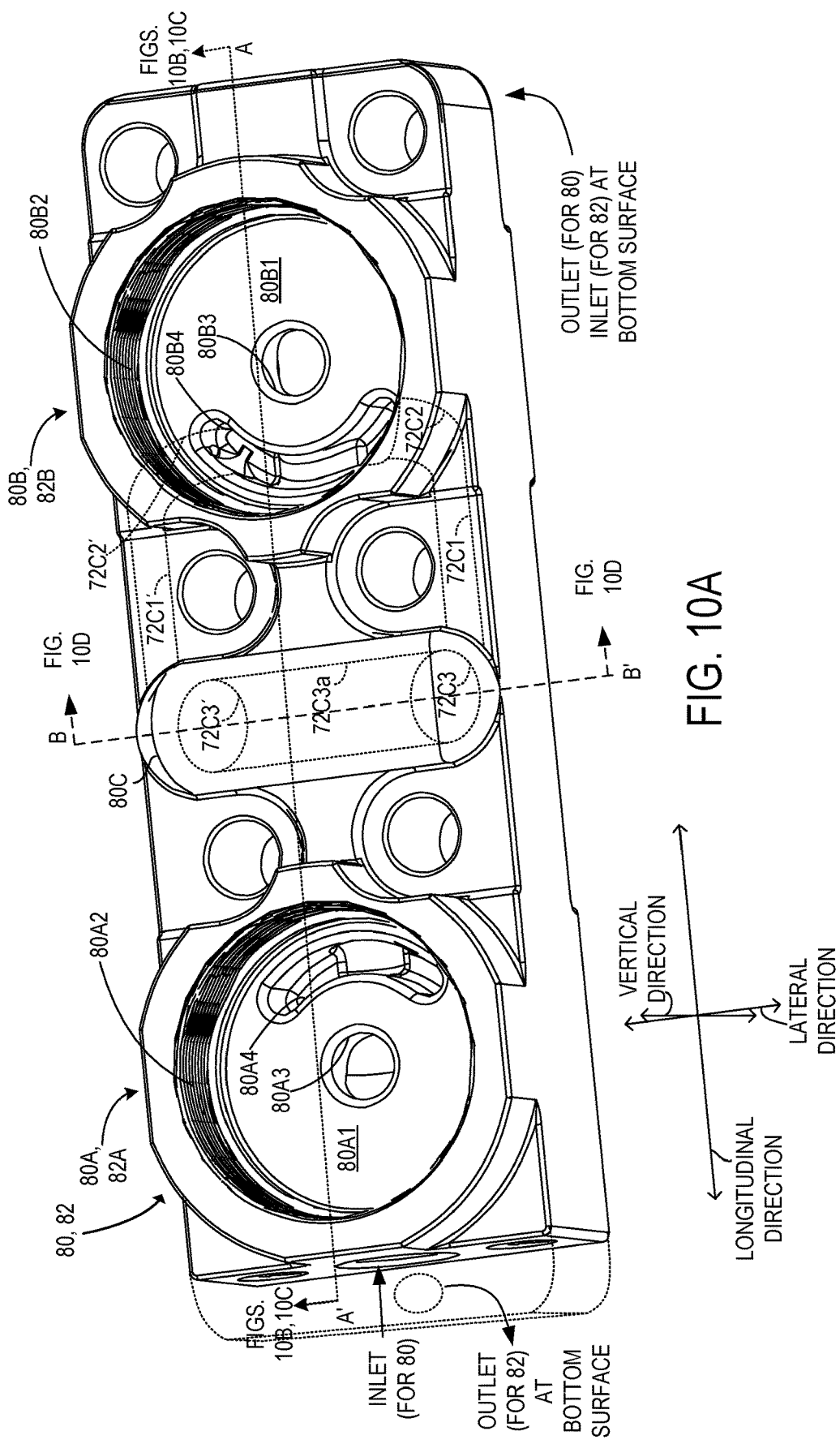
FIG. 10A shows a perspective view of an upstream flow block of the gas delivery system of FIG. 1, a downstream flow block of the gas delivery system being of similar construction.

FIG. 10A shows a perspective view of the upstream flow block 80 of the gas delivery system of FIG. 1. It will be appreciated that the downstream flow block 82 of the gas delivery system 10 is of a similar construction and thus FIGS. 10A and 10D will be used to explain both flow blocks. Where similar, only upstream flow block 80 will be described for the sake of brevity. One difference in construction between upstream flow block 80 and the downstream flow block 82 is that both the inlet and outlet of downstream flow block 82 are formed in a bottom surface of the flow block, whereas the inlet of upstream flow block 80 is formed in a side of the flow block. as shown in FIG. 10A. Dashed lines in FIG. 10A show the configuration of downstream flow block 82 with an inlet on the bottom surface. It will be appreciated that the upstream flow block 80 and the downstream flow block 82 are mounted onto dual-purpose mounting and flow blocks 37 and 39, respectively, that are subsequently mounted to a top surface 19A of the mechanical backplane 19.

As shown in FIG. 10A, a first mount 80A is provided on the upstream flow block 80 to accommodate and secure the upstream shutoff valve 32A, and a second mount 80B is provided on the upstream flow block 80 to accommodate and secure the first upstream purge shutoff valve 34A. A first mount 82A is provided on the downstream flow block 82 to accommodate and secure the downstream shutoff valve 40A, and a second mount 82B is provided on the downstream flow block 82 to accommodate and secure the downstream purge shutoff valve 38A. The first mount 80A and the second mount 80B are provided with threads 80A2, 80B2 so that the valves 32A, 34A may be screwed onto the upstream flow block 80. In addition within each mount 80A and 80B is formed a corresponding valve seat surface 80A1, 80B1 with two ports formed therein, a first port 80A3, 80B3 formed in a center of the valve seat surface 80A1, 80B1, and a second port 80A4, 80B4 formed in a partial radial arc shape, at a location that is outward radially from the first port 80A3, 80B3. A bulge 80C in a central region of a top surface of the upstream flow block 80 accommodates a laterally extending flow path within the flow block as will be explained below.

Figure 10B:
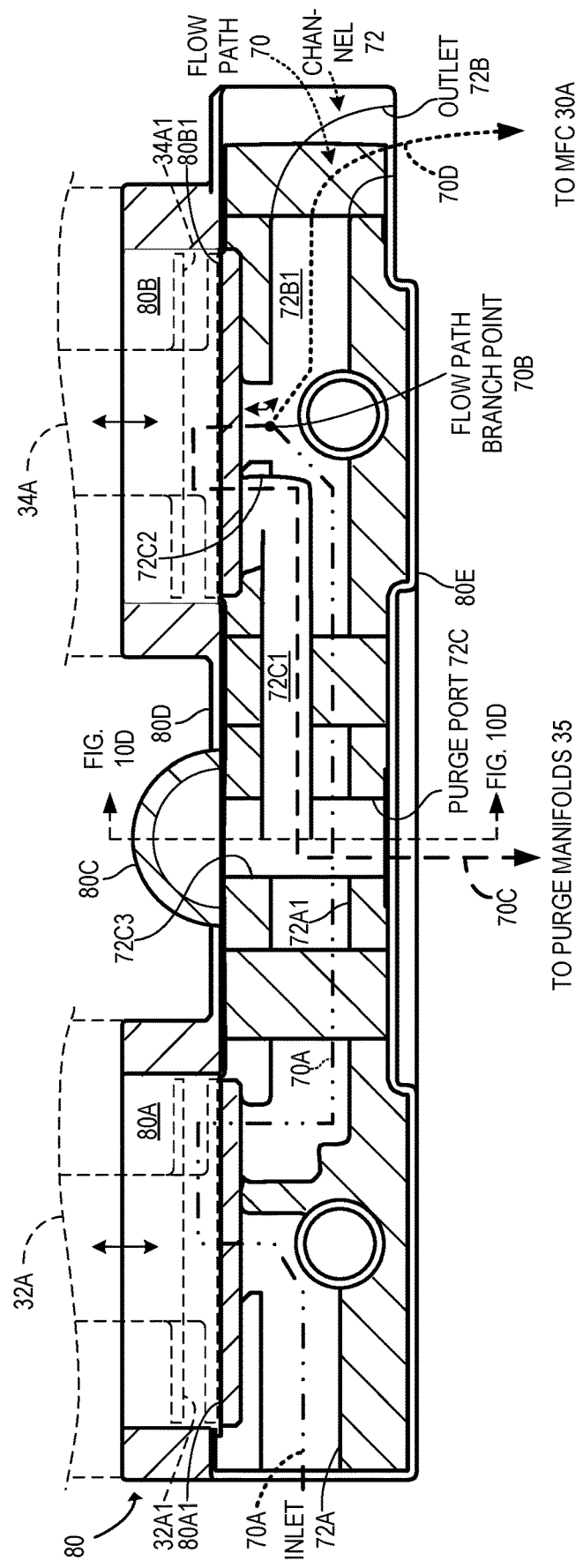
FIG. 10B shows a cross-sectional view of the upstream flow block taken along A-A' in FIG. 10A, illustrating a branching flow path connecting an inlet to an outlet and a purge port of the upstream flow block, and a pair of upstream shutoff valves to control flow of gas through each branch of the branching flow path.

FIG. 10B shows a cross-sectional view of the upstream flow block 80 taken along A-A' in FIG. 10A. Each upstream flow block 80 includes an inlet 72A, an outlet 72B, and a purge port 72C. Each upstream flow block 80 includes a branching flow path 70 that flows through a flow channel 72 from an inlet 72A of the flow channel to an outlet 72B, and through a purge branch 70C leading from a branch point 70B to the purge port 72C of the flow channel. At least a portion of the branching flow path 70 may include a heated line that is configured to vaporize an incoming liquid into a gas that is supplied to the mass flow controller 30. An upstream flow block 80 equipped with such a heated vaporization line may be referred to as a vaporization module. It will be appreciated that a subset of the rows of the gas delivery device 10 may be provided with such vaporization modules as upstream flow blocks, and either or both of flow blocks 37 and 39, and/or mixing manifold 48 may be equipped with passages that mix vaporized gas from the vaporization modules with gas that has flowed through upstream flow blocks 37 that are not equipped with heated lines. The branching flow path 70 extends from the inlet 72A along an inlet branch 70A of the flow path to a branch point 70B, where the flow path divides into an outlet branch 70D and the purge branch 70C. From the branch point 70B, the flow path flows along the outlet branch 70D leading from the branch point 70B to the outlet 72B and from the branch point 70B along the purge branch 70C to the purge port 72C of the flow channel 72. A first upstream purge shutoff valve 34A is positioned in the purge branch 70C and is configured to control flow of gas from the inlet 72A to the purge port 72C, and a first upstream shutoff valve 32A is positioned in the inlet branch 70A and configured to control flow of gas to and from the inlet 72A to the outlet 72B through the internal outlet channel 72B1 along the outlet branch 70D. Opening the first upstream shutoff valve 32A allows for gas to flow from the inlet 72A to the branch point 70B. Thus, it will be appreciated that both shutoff valves 32A and 34A are opened during purge operations so that purge gas flows from the inlet 72A to the purge port 72C and ultimately out the upstream purge manifold 35. The outlet 72B of the upstream flow block 80 connects to flow block 37, which guides the gas into the inlet of each mass flow controller. During non-purge operations, the first upstream purge shutoff valve 34A is closed and upstream shutoff valve 32A is opened, allowing gas to flow from the gas source 28A, through the inlet branch 70A and outlet branch 70D of the flow path 70, to the mass flow controller 30A. Another flow block 39 is positioned to guide the gases from the outlet of the mass flow controller 30A to the inlet of the downstream flow block 82.

Figure 10C:
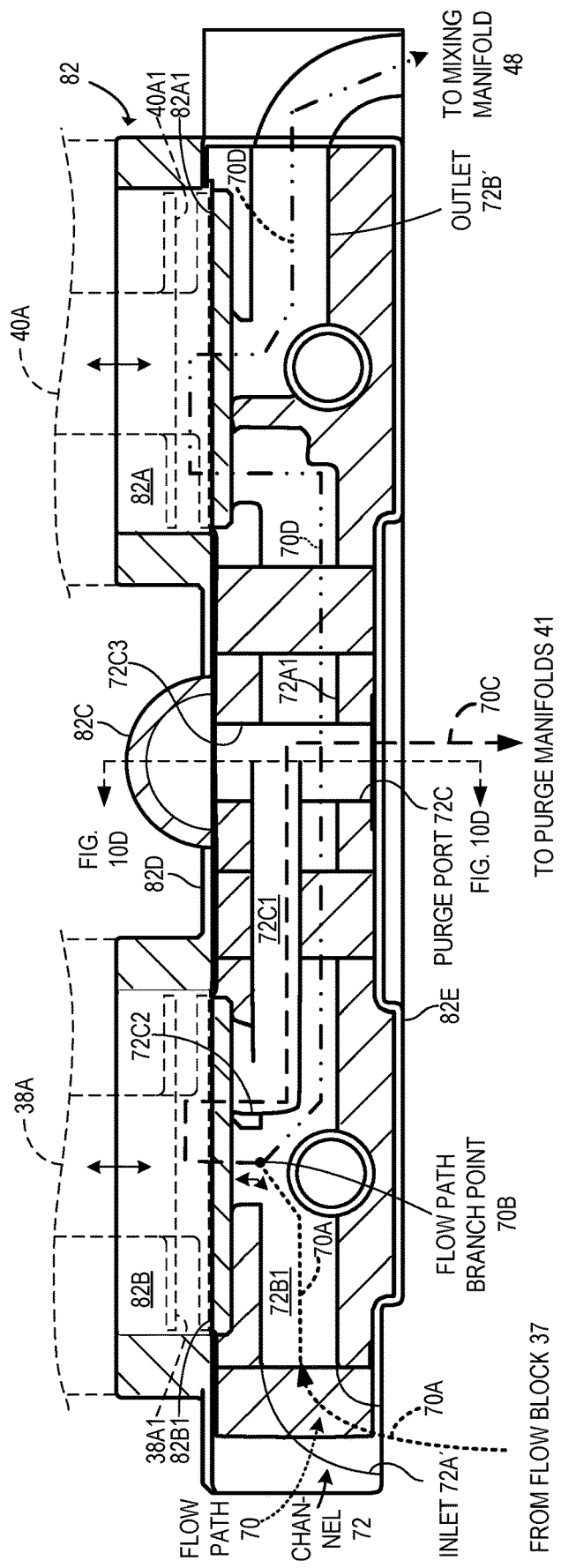
FIG. 10C shows a cross-sectional view of the downstream flow block taken along A-A' in FIG. 10A, illustrating a branching flow path connecting an inlet to an outlet and a purge port of the downstream flow block, and a pair of downstream shutoff valves to control flow of gas through each branch of the branching flow path.

Referring to FIG. 10C, a first mount 82A is provided on the downstream flow block 82 to accommodate and secure the downstream shutoff valve 40A, and a second mount 82B is provided on the downstream flow block 82 to accommodate and secure the downstream purge shutoff valve 38A. The first mount 82A and the second mount 82B are provided with threads so that the valves 38A, 40A may be screwed onto the downstream flow block 82. In addition within each mount 82A and 82B is formed a corresponding valve seat surface 82A1, 82B1. A bulge 82C in a central region of a top surface of the downstream flow block 82 accommodates a laterally extending flow path within the flow block similarly to the bulge 80C of the upstream flow block 80.

Further referring to FIG. 10C, it will be appreciated that each downstream flow block 82 includes an inlet 72A', an outlet 72B', and a purge port 72C. Unlike the upstream flow block 80, the inlet 72A' of the downstream flow block 82 is positioned on the bottom surface of the flow block, as shown in FIG. 10C. Each downstream flow block 82 includes a branching flow path 70 that flows through the flow channel 72 extending from the inlet 72A' along an inlet branch 70A of the flow path 70 to a branch point 70B, where the flow path 70 divides into an outlet branch 70D leading from the branch point 70B to the outlet 72B', and a purge branch 70C leading from the branch point 70B to the purge port 72C. The downstream flow block 82 further includes a first downstream purge shutoff valve 38A positioned in the purge branch 70C and configured to control flow of gas from the inlet 72A' to the purge port 72C, and a second downstream shutoff valve 40A positioned in the outlet branch 70D and configured to control flow of gas from the inlet 72A' to the outlet 72B' along the outlet branch 70D. The outlet 72B' of each downstream flow block 82 is fluidically connected to a respective inlet of the mixing manifold 48. The outlet 72B' of the downstream flow block 82 connects to the mixing manifold 48, which guides the gas into the inlet of each flow ratio controller. It will be appreciated that both downstream purge shutoff valve 38A and downstream shutoff valve 40A are opened during purge operations so that purge gas flows to and from the inlet 72A to the purge port 72C and ultimately out the downstream purge manifold 41. During controlled flow operations to the chambers, the first downstream purge shutoff valve 38A is closed, preventing gas flow to the purge manifold 41, and the second downstream shutoff valve 40A is opened.

Referring to FIGS. 10B and 10C, at least one of the upstream and downstream flow blocks 80, 82 includes an internal channel 72C1 extending horizontally and longitudinally and being positioned between a top surface 80D, 82D and bottom surface 80E, 82E of the flow block 80, 82. The internal channel 72C1 forms a portion of the purge branch 70C of the flow path 70, connecting the radially shaped second port 80B4 shown in FIG. 10A with the U-shaped channel of FIG. 10C. For the upstream flow block 80, the internal channel 72C1 is fluidically connected to the first upstream purge shutoff valve 34A via a first vertical channel 72C2 that extends downward from the second port 80B4. For the downstream flow block 82, the internal channel 72C1 is fluidically connected to the downstream purge shutoff valve 38A via the first vertical channel 72C2. Although in FIG. 10B only one such internal channel 72C1 and vertical channel 72C2 are visible, as shown in FIG. 10A in dashed lines, a right and left internal channel 72C1, 72C1' and a right and left first vertical channel 72C2 and 72C2' are provided and are fluidically connected to each end of the second port 80B4.

Figure 10D:
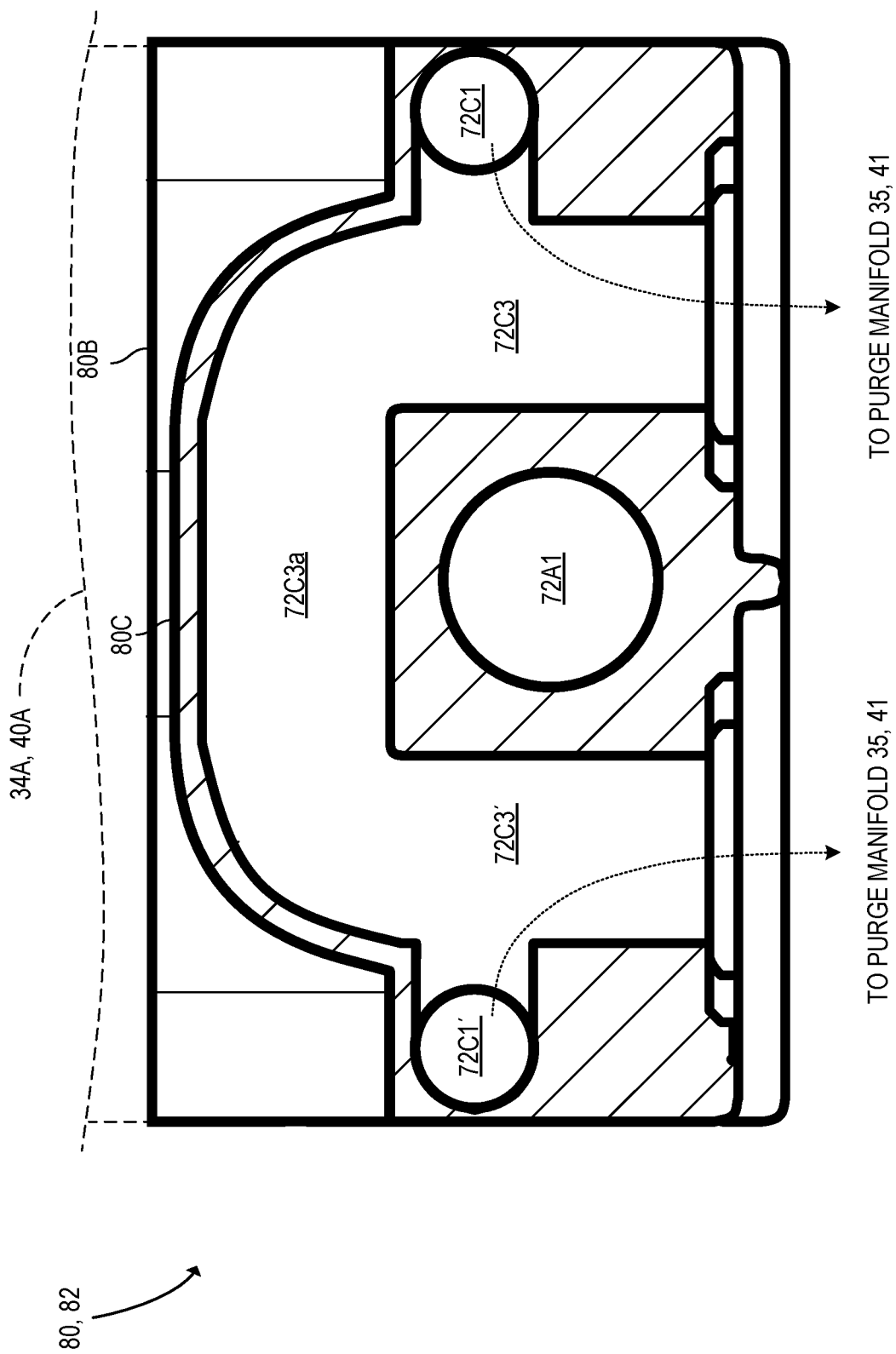
FIG. 10D shows a cross-sectional view of the upstream flow block taken along B-B' in FIG. 10A, illustrating an upside down U-shaped channel linking a pair of internal horizontal channels of a purge branch of the branching flow path, and a central bore of an inlet branch of the branching flow path.

Continuing with FIG. 10B, the internal channel 72C1 is fluidically connected to the purge port 72C via a second vertical channel 72C3, and the internal channel 72C1' shown in FIG. 10A is also connected to the purge port 72C via a second vertical channel 72C3' shown in FIGS. 10A and 10D. As described below, the right and left second vertical channel 72C3, 72C3' are fluidically connected by a laterally extending channel 72C3a. Continuing with FIGS. 10B and 10C, it can be seen that each of the first upstream purge shutoff valve 34A and second downstream shutoff valve 40A is positioned closer to the outlet than the inlet. As the internal channel 72C1 cannot easily be formed by traditional manufacturing processes such as milling or drilling due to its location inside the flow block, alternative manufacturing processes may be used. For example, the upstream flow block 80 including the internal channels 72C1 and 72C1' may be formed by an additive manufacturing process, such as three-dimensional printing. Additive manufacturing refers to manufacturing processes in which material is joined together to additively create a workpiece's final shape, usually layer by layer based upon a three-dimensional computer aided design computer aided manufacturing (CADCAM) model, and can be contrasted with reductive processes such as machining that remove material. For example, an additive manufacturing process such as such as three-dimensional printing, powder bed fusion, sheet lamination, directed energy deposition, or direct metal laser sintering may be utilized. By additively manufacturing the flow block, flow channels having complex internal shapes may be created in an integral block of material, thus reducing the need to bolt, weld, machine, or otherwise combine sections of the flow block together, which could result in leakage. Furthermore, additive manufacturing achieves the production of internal contours and flow paths that are not otherwise available with conventional machining processes.

FIG. 10B also illustrates the operation of the upstream shutoff valves 32A, 34A. Each of these valves includes an actuator that drives a valve surface 32A1, 34A1 up and down, to selectively make contact or separate from a valve seat surface 80A1, 80B1. This movement controls opening and closing of the valve, and allows gas to selectively flow through the valve, along the respective inlet branch 70A or purge branch 70C of the flow path 70 as indicated. FIG. 10C similarly illustrates the operation of the downstream purge shutoff valve 38A and downstream shutoff valve 40A. Each of these valves includes an actuator that drives a valve surface 38A1, 40A1 up and down, to selectively make contact or separate from a valve seat surface 82A1, 82B1. This movement controls opening and closing of the valve, and allows gas to selectively flow through the valve, along the respective inlet branch 70A or purge branch 70C of the flow path 70 as indicated. Each of shutoff valves 32A, 34A, 38A, 40A is typically a pneumatically controlled shutoff valve, although other valve types are possible.

FIG. 10D shows a cross-sectional view of the upstream flow block 80 taken along B-B' in FIG. 10A, the downstream flow block 82 being identical in this cross-section. An upside down U-shaped channel is formed in the upstream flow block 80 by second vertical channel 72C3 on the right side, second vertical channel 72C3" on the left side, and laterally extending channel 72C3a that fluidically connects each of the pair of right and left second vertical channels 72C3, 72C3". The U-shaped channel is fluidically connected to each of a pair of internal horizontal channels 72C1, 72C1" that extend on the right and left sides of the upstream flow block 80 in a longitudinal direction of a purge branch of the branching flow path, from the first vertical channel 72C2 to the second vertical channel 72C3, and, as can be seen in FIG. 10A from the first vertical channel 72C2" to the second vertical channel 72C3". Continuing with FIG. 10D, a central bore of an inlet channel 72A1 of the inlet branch 70A of the branching flow path 70 is formed in a laterally and vertically central region of the upstream flow block 80, surrounded on upper and right and left sides by the U-shaped channel. In this way, the inlet branch of the flow path is carried in the inlet channel 72A1, fluidically separated in this view from the purge branch 70C of the flow path carried in the U-shaped channel and internal horizontal channels 72C1, 72C1". In some example, the purge branch 70C may be configured as a purge/vacuum branch, and the purge manifolds 35, 41 connected to the purge/vacuum branch may be connected to a vacuum pump to purge gases from the system, while in other examples a purge gas may be flowed through the system and out the purge manifolds 35, 41 to complete the purge operation.

During operation, the gas source 28A is activated and gas is flowed from the gas source 28A to the inlet of the upstream flow block 80. The upstream shutoff valve 32A is opened to allow gas to flow through the upstream flow block, and the first upstream purge shutoff valve 34A, which controls the branching flow to the purge manifold, is closed. All gas entering the inlet is thus allowed to flow through the upstream flow block 80 to the outlet. The gas then passes through flow block 37 to enter the inlet of the mass flow controller flow block 81, which will be described below in detail. The mass flow controller flow block 81 includes a flow path from an inlet to an outlet of the mass flow controller flow block 81. The first flow control valve 36A controls the flow rate of the gas flowing through the mass flow controller flow block 81. Gas exits the mass flow controller flow block 81 to travel through the flow block 39 to enter downstream flow block 82. The downstream shutoff valve 40A of the downstream flow block 82 is open to allow gas to flow through the downstream flow block 82 while the downstream purge shutoff valve 38A is closed to prevent escape of the gas out the purge manifold 41. Gas exits the outlets of the downstream flow block 82 to enter the mixing manifold 48 where it is mixed with gases from other rows in the gas delivery system 10, before being guided to one of the plurality of flow ratio controllers 26A-26D. The flow ratio controllers 26A-26D each perform flow ratio control on gases exiting the mixing manifold 48, to thereby deliver a predetermined ratio of the total flow from their respective outlets.

Figure 11A:
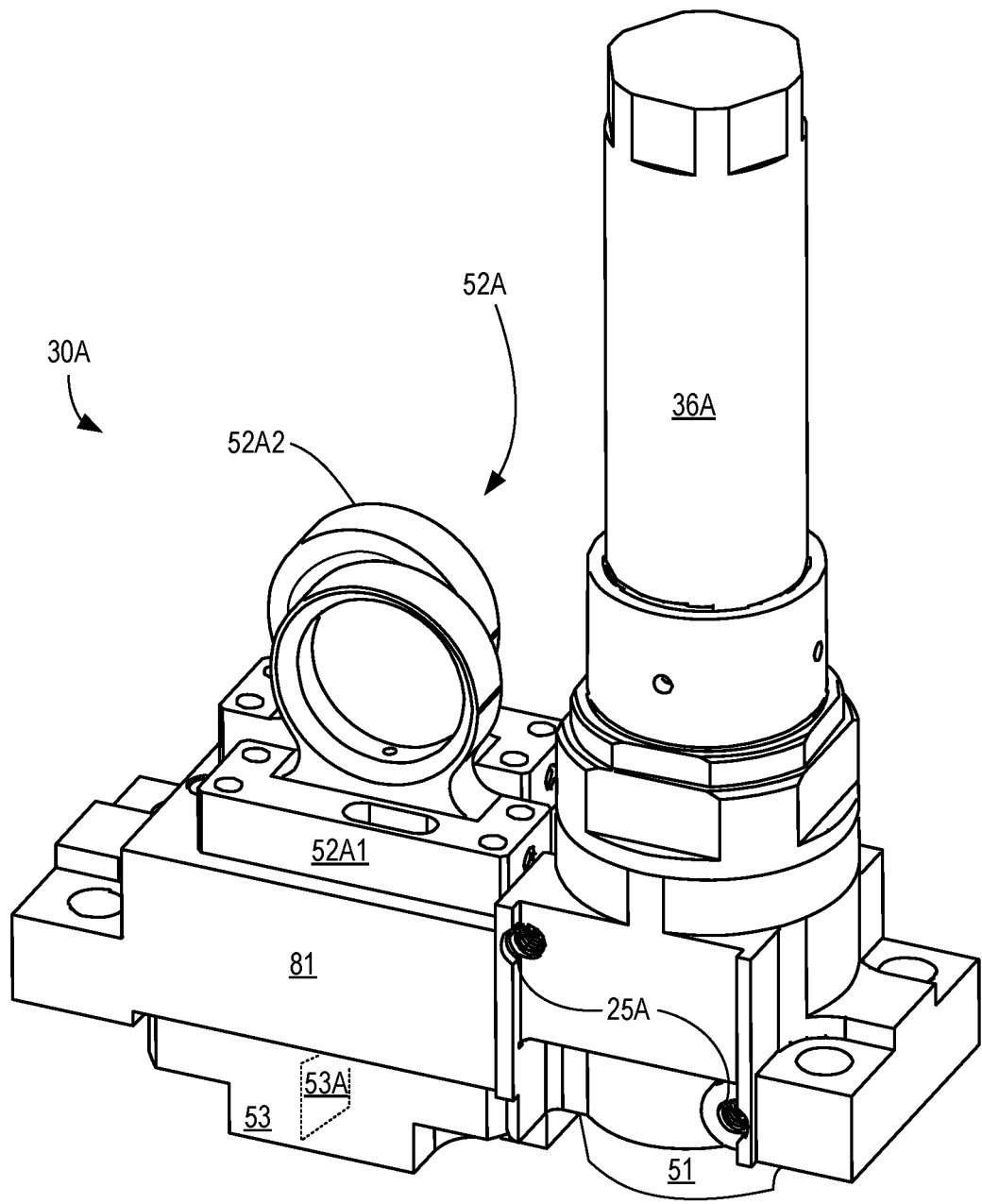
FIG. 11A shows a perspective view a mass flow controller section of the gas delivery system of FIG. 1 with the printed circuit board removed, showing a mass controller flow block and a flow control valve, a pressure sensor system, and upstream pressure sensor attached thereto.

Referring now to FIG. 11A, a mass flow controller flow block 81 of mass flow controller 30A is depicted in a perspective view with a flow control valve 36A, a restrictor housing 53 that houses a restrictor 53A, a pressure sensor pair 52A including a first pressure sensor 52A1 positioned to measure pressure in the fluid channel on a first side of the restrictor 53A and a second pressure sensor 52A2 positioned to measure pressure in the fluid channel on a second side of the restrictor 53A, as well as an upstream pressure sensor 51 installed upstream of the restrictor 53A and configured to measure pressure in a vicinity adjacent the flow control valve 36A. It will be appreciated that the first and second pressure sensors 52A1 and 52A2 are respectively positioned on opposite sides of the restrictor 53A. A pair of threaded holes 25A are positioned in a side of the mass flow controller flow block 81, into which fasteners 25B (see FIG. 4) may be inserted to thereby secure the printed circuit board of the mass flow control circuitry 30A1.

Figure 11B:
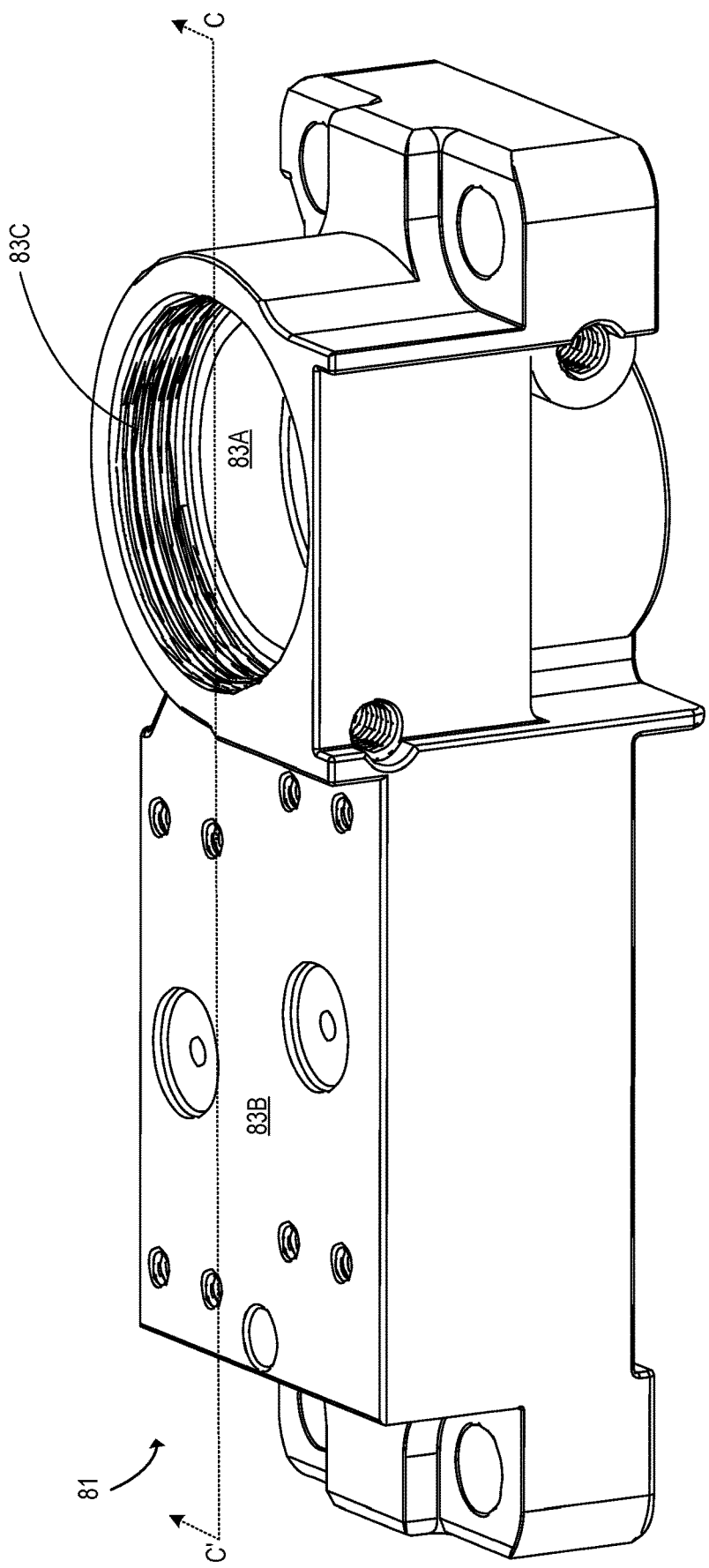
FIG. 11B shows a perspective view of the mass flow controller flow block of FIG. 11A with various components removed.

In the view of FIG. 11B, the upstream pressure sensor 51, the pressure sensor pair 52A, and the flow control valve 36A are omitted to show the valve seat surface 83A against which the valve of the flow control valve closes to seal the valve. Threads 83C are shown for securing the flow control valve 36A to the flow block. Mounting surface 83B is illustrated on the mass flow controller flow block 81 and is configured to accommodate and secure the first pressure sensor 52A1 and second pressure sensor 52A2 of the pressure sensor pair 52A.

Figure 11C:
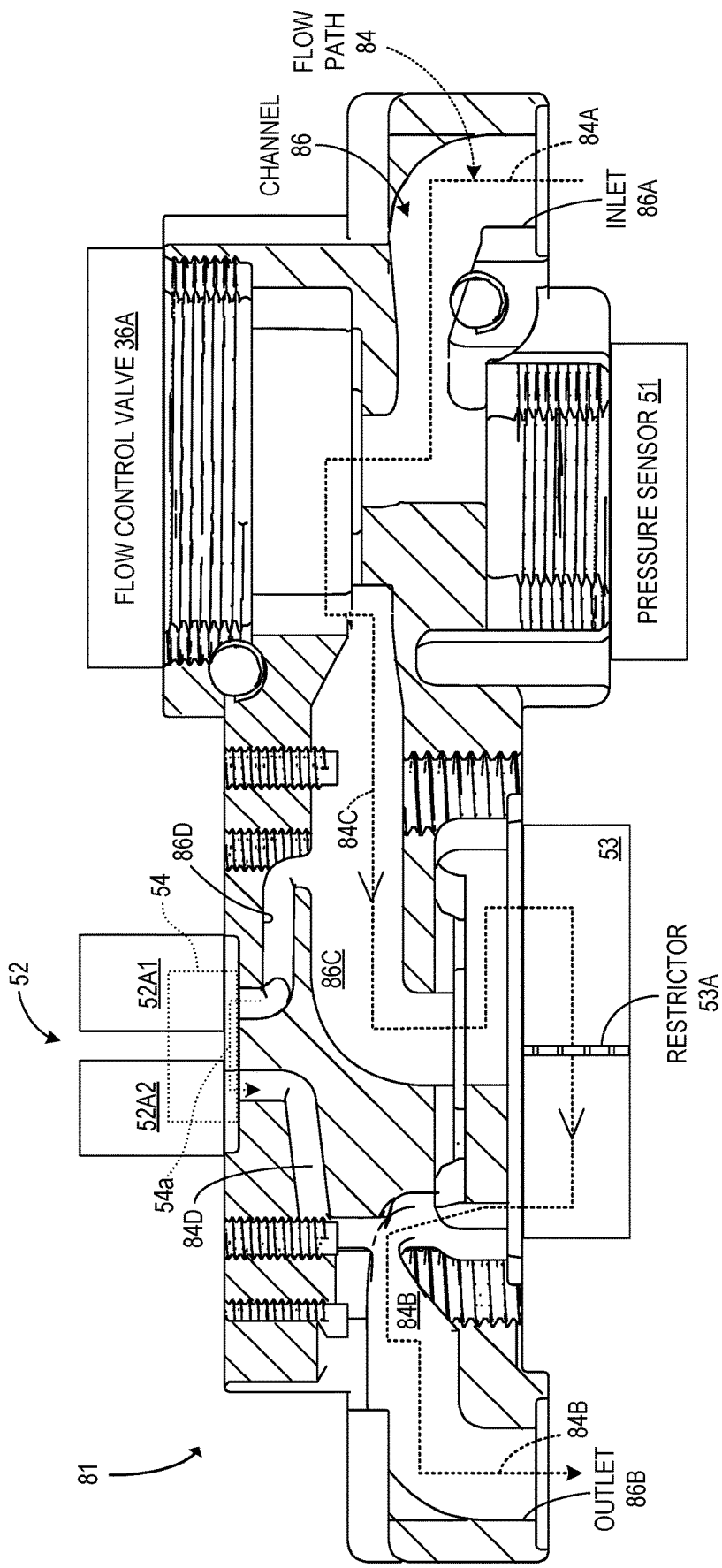
FIG. 11C shows a cross-sectional view of the mass flow controller flow block taken along line C-C of FIG. 11B with attached components shown schematically, illustrating a gas flow path from an inlet to an outlet, a flow control valve, a bypass line with a pressure sensor system coupled thereto, and a upstream pressure sensor, according to one example of the present disclosure.

Referring to FIG. 11C, a cross-sectional view of the mass flow controller flow block 81 is depicted. In this view, the upstream pressure sensor 51, the restrictor 53A, the first pressure sensor 52A1 and second pressure sensor 52A2 of the pressure sensor pair 52A, and the flow control valve 36A are depicted schematically in their general attachment locations, which are more precisely indicated in FIG. 11A. This cross-sectional view shows a flow path 84 passing through a flow channel 86, which extends from an inlet 86A to an outlet 86B. An inlet branch 84A of the flow path 84 extends from the inlet 86A, passing by the upstream pressure sensor 51, and flowing through the flow control valve 36A. The flow control valve 36A is mounted in the flow path 84 on the inlet branch 84A and is configured to control the flow rate of gas flowing through the flow path 84. The upstream pressure sensor 51 is mounted upstream of the control valve 36A and configured to detect the pressure of the gas flowing along the flow path 84 in the inlet branch 84A upstream of the control valve 36A. The first pressure sensor 52A1 and the second pressure sensor 52A2 of the pressure sensor pair 52A are mounted downstream of the flow control valve 36A. The first pressure sensor 52A1 is positioned upstream of the restrictor 53A, while the second pressure sensor 52A2 is positioned downstream of the restrictor 53A when gas is flowed from inlet to outlet in FIG. 11C. The restrictor 53A is provided in the internal channel 86C to choke the flow of gas flowing in the internal channel 86C. The first pressure sensor 52A1 is positioned at the terminus of a first branch channel 86D branching from the internal channel 86C at the upstream side of the restrictor 53A, and configured to detect the pressure of the gas flowing along the main internal branch 84C upstream of the restrictor 53A. The main internal branch 84C of the flow path 84 travels through the internal channel 86C, in which it first flows generally horizontally in a longitudinal direction and then travels downward toward the restrictor 53A and then turns back upwards toward the outlet 86B. It will be appreciated that such a construction, involving an internal channel 86C with multiple 90-degree bends, would not be possible to manufacture in an integral flow block with conventional approaches such as drilling or milling. Accordingly, the mass flow controller flow block 81 with such an internal horizontal channel may be manufactured by additive manufacturing processes, like the other flow blocks described herein.

A second branch channel 84D is provided branching from the outlet branch 84B of the flow path 84 in the internal channel 86C at the downstream side of the restrictor 53A. The second pressure sensor 52A2 of the pressure sensor pair 52A is positioned at a terminus of the second branch channel 84D, and configured to detect the pressure of the gas flowing along the outlet branch 84B downstream of the restrictor 53A. Pressures upstream and downstream of the restrictor 53A are measured by first pressure sensor 52A1 and second pressure sensor 52A2, respectively, and the flow rate of gas flowing can be computed from a difference between these detected pressures. This information can be continuously used, in a feedback control loop, by the mass flow control circuitry 30A1 of the mass flow controller 30A to control the flow through the flow control valve 36A, for example, to trend toward a flow rate set point, i.e., a desired flow rate. In this manner, gas can be delivered from the outlet 86B of the mass flow controller 30A at a stable flow rate. The upstream pressure sensor 51 detects a pressure upstream of the restrictor 53A in a vicinity of the flow control valve 36A, and processing circuitry of the mass flow controller 30A checks to ensure that the detected pressure is within an acceptable operational range during operation.

It will be appreciated that, in other embodiments, the pressure sensor pair 52A may be replaced with a single pressure sensor or a single thermal mass flow sensor 54. For example, as illustrated in FIG. 11C, when the mass flow controller 30A is configured as a thermally based mass flow controller, the pressure sensor pair 52A may be configured as a single thermal mass flow sensor 54 that measures a temperature change associated with adding a known amount of heat to flowing fluid, or measures the amount of heat required to maintain the thermal mass flow sensor 54 at a constant temperature. Here, one bypass line 54a is provided to the thermal mass flow sensor 54 instead of two branch channels 86D, 84D provided with two pressure sensors 52A1, 52A2 at their respective termini. It will be appreciated that, unlike the pressure mass flow controller, the thermal mass flow controller has a flow path through the bypass line 54a from one side of the restrictor to the other, i.e., fluidically connecting the two branch channels 86D, 84D.

Figure 12:
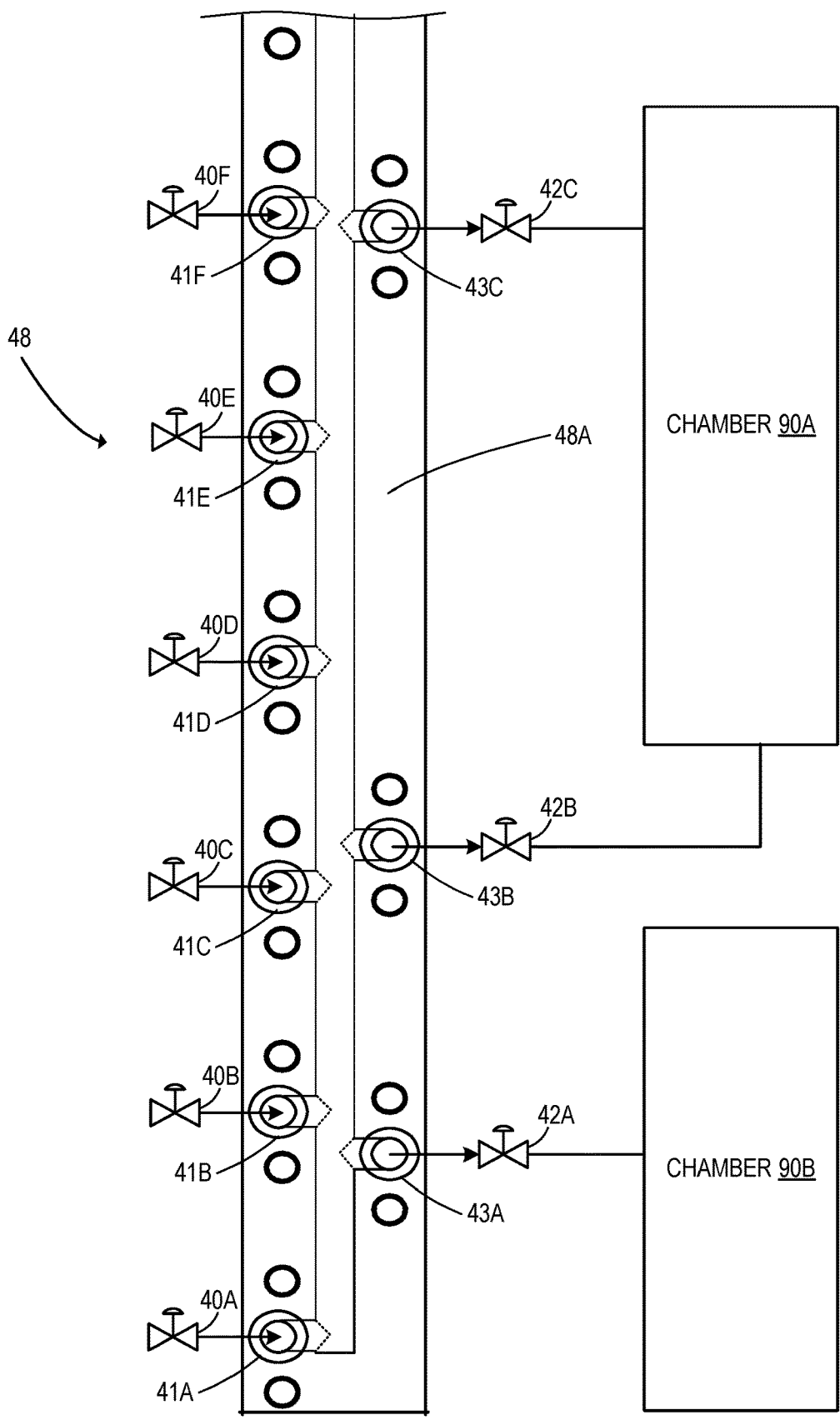
FIG. 12 shows a top view of a mixing manifold of the gas delivery system of FIG. 1, coupled to schematically illustrated chambers.

Referring to FIG. 12, a partial top view of a mixing manifold 48 mounted onto the mechanical backplane 19 is depicted according to one example of the present disclosure. In this view, open downstream shutoff valves 40A-40D are flowing gas into flow inlets 41A-41D of the mixing manifold 48. The gases flowing into the flow inlets 41A-41D mix within the mixing chamber 48A, which is configured to cause turbulent flows within the mixing chamber 48A to enhance the mixing of the gases entering the mixing manifold 48. Structural elements within the mixing chamber 48A which aid in the mixing of the gases may include helical grooves and/or serpentine flow paths, for example. The gases that are mixed within the mixing chamber 48A flow out of the mixing manifold 48 through the flow outlets 43A-43C and leave the mixing manifold 48 to enter the flow ratio shutoff valves 42A-42D. In the example of FIG. 12, the gases flow past the flow ratio shutoff valves 42A-42D and reach chambers 90A, 90B.

In accordance with the present disclosure, tighter gas control and delivery are achieved by reducing redundancy within the gas delivery system. Material costs are lowered because of the reduction of redundant components, which lead to smaller overall size and weight. Centralized data acquisition, data communication, and control improves long-term repeatability. Local data storage maintains all data from each process run, so that the end user can review yield versus gas delivery performance. An integrated, real-time central control may process all sensor data in one location, control the entire gas delivery, and log all data into the central data repository in real time. In addition, with all real-time sensor data stored in one location, sophisticated performance analysis can be done with machine learning and in-process real-time adjustments of flow parameters to improve performance and repeatability in the gas delivery system.

The following paragraphs provide additional support for the claims of the subject application. One aspect provides a gas delivery system comprising an electrical backplane; a system controller operatively coupled to the electrical backplane; and a plurality of mass flow controllers, each including respective mass flow control circuitry operatively coupled to the electrical backplane, the system controller and each mass flow control circuitry being physically mounted to the electrical backplane. In this aspect, additionally or alternatively, each mass flow controller may be physically mounted on the electrical backplane via a respective electrical connector. In this aspect, additionally or alternatively, the electrical backplane may include a backplane printed circuit board; each mass flow control circuitry may include a respective local printed circuit board that is physically mounted on the electrical backplane via a board-to-board electrical connection between the local printed circuit board and the backplane printed circuit board. In this aspect, additionally or alternatively, the gas delivery system may further comprise a mechanical backplane onto which the plurality of mass flow controllers are physically mounted. In this aspect, additionally or alternatively, the mechanical backplane may include a top surface, a bottom surface, and a plurality of openings extending from the top surface to the bottom surface; the electrical backplane may be mounted to the bottom surface of the mechanical backplane and may be spaced apart from the bottom surface by a gap; each mass flow controller may be mounted to the top surface of the mechanical backplane; and a portion of each mass flow controller mass flow controller may extend through a respective opening of the plurality of openings to reach the electrical backplane. In this aspect, additionally or alternatively, the mass flow controllers may be mounted in rows, each row including an associated flow path extending from a respective inlet to a mixing manifold. In this aspect, additionally or alternatively, the mass flow controllers are selected from the group consisting of a pressure mass flow controller, a thermal mass flow controller, and a restrictorless mass flow controller. In this aspect, additionally or alternatively, each mass flow controller may include a mass flow controller flow block including a flow path from an inlet to an outlet of the mass flow controller flow block; a flow control valve mounted in the flow path and configured to control a flow rate of gas flowing through the flow path; a pressure sensor pair comprising a first pressure sensor and a second pressure sensor respectively positioned on opposite sides of a restrictor in the flow path; and an upstream pressure sensor mounted upstream of the restrictor and configured to measure pressure in a flow channel adjacent the flow control valve. In this aspect, additionally or alternatively, in each row, each mass flow controller may have an associated upstream flow block; each upstream flow block may include an inlet, an outlet, and a purge port, each upstream flow block may include a branching flow path including an inlet branch from the inlet to a branch point, an outlet branch leading from the branch point to the outlet, and a purge branch leading from the branch point to the purge port; an upstream shutoff valve positioned in the inlet branch and configured to control flow of gas from the inlet to the outlet along the outlet branch; and an upstream purge shutoff valve positioned in the purge branch and configured to control flow of gas from the inlet to the purge port. In this aspect, additionally or alternatively, in each row, each mass flow controller may have an associated downstream flow block; each downstream flow block may include an inlet, an outlet, and a purge port, each downstream flow block may include a branching flow path including an inlet branch from the inlet to a branch point, an outlet branch leading from the branch point to the outlet, and a purge branch leading from the branch point to the purge port; a downstream purge shutoff valve positioned in the purge branch and configured to control flow of gas from the inlet to the purge port; and a downstream shutoff valve positioned in the inlet branch and configured to control flow of gas from the inlet to the outlet along the outlet branch. In this aspect, additionally or alternatively, at least one of the upstream and downstream flow blocks may include an internal channel extending horizontally and being positioned between a top surface and a bottom surface of the upstream or downstream flow block, the internal channel forming a portion of the purge branch of the flow path. In this aspect, additionally or alternatively, the internal channel may be fluidically connected to one of the upstream purge shutoff valve or the downstream purge shutoff valve via a first vertical channel; the internal channel may be fluidically connected to the purge port via a second vertical channel; and the one of the upstream purge shutoff valve or downstream purge shutoff valve may be positioned closer to the outlet than the inlet. In this aspect, additionally or alternatively, the internal channel may be formed by an additive manufacturing process. In this aspect, additionally or alternatively, the gas delivery system may further comprise a plurality of flow ratio controllers, each including respective flow ratio control circuitry operatively coupled to the electrical backplane, the flow ratio control circuitry being physically mounted to the electrical backplane. In this aspect, additionally or alternatively, the gas delivery system may further comprise a mixing manifold configured to receive gas from each mass flow controller, mix the gas, and guide the gas to respective inlets of each of the flow ratio controllers. In this aspect, additionally or alternatively, the gas delivery system may further comprise a plurality of pressure controllers, each including respective pressure control circuitry operatively coupled to the electrical backplane, the pressure control circuitry being physically mounted to the electrical backplane. In this aspect, additionally or alternatively, the electrical backplane may include an electrical bus system including a control bus configured to route control signals between the system controller and each controlled mass flow controller. In this aspect, additionally or alternatively, the electrical backplane may further include an electrical bus system including a configuration bus configured to route configuration signals between the system controller and each controlled mass flow controller. In this aspect, additionally or alternatively, the electrical backplane may include a power bus configured to supply power to each mass flow control circuitry, the system controller, and a plurality of valves. In this aspect, additionally or alternatively, the gas delivery system may further comprise non-volatile memory operatively coupled to the system controller. The system controller may be further configured to collect valve position information and sensor information from at least a plurality of sensors and valves that are operatively coupled to each mass flow control circuitry and store the valve position information and sensor information into data logs stored in the non-volatile memory. In this aspect, additionally or alternatively, the gas delivery system may further comprise a coprocessor mounted to the electrical backplane. The coprocessor may coordinate asynchronous data communications between the system controller and each mass flow control circuitry. In this aspect, additionally or alternatively, the coprocessor may deserialize serialized data streams from each mass flow control circuitry to generate deserialized data streams, and send the deserialized data streams to the system controller; and the coprocessor may further serialize data streams from the system controller to generate serialized data streams, and send the serialized data streams to each mass flow control circuitry. In this aspect, additionally or alternatively, each data stream may include an address of the mass flow control circuitry from which the data stream was sent.

Another aspect provides a gas delivery system comprising an electrical backplane; a system controller operatively coupled to and physically mounted to the electrical backplane; and a plurality of controlled modules, each including a respective printed circuit board operatively coupled to the electrical backplane, the printed circuit board of each controlled module being electrically connected to and physically mounted to the electrical backplane via a board-to-board electrical connector. The controlled modules are selected from the group consisting of a mass flow controller, a flow ratio controller, a pressure controller, an external bus extension, a precursor module, an in-situ metrology system, a thermal-based mass flow controller, and a restrictor-less mass flow controller. In this aspect, additionally or alternatively, the gas delivery system may further comprise non-volatile memory mounted to the electrical backplane and operatively coupled to the system controller. The system controller may be further configured to collect valve position information and sensor information from at least a plurality of sensors and valves that are operatively coupled to each printed circuit board of each controlled module and store the valve position information and sensor information into data logs stored in the non-volatile memory. In this aspect, additionally or alternatively, the gas delivery system may further comprise a mechanical backplane onto which the plurality of controlled modules are physically mounted, the mechanical backplane including a top surface, a bottom surface, and a plurality of openings extending from the top surface to the bottom surface. The electrical backplane may be mounted to the bottom surface of the mechanical backplane and may be spaced apart from the bottom surface by a gap; each controlled module may be mounted to the top surface of the mechanical backplane; and a portion of the printed circuit board of each controlled module may extend through a respective opening of the plurality of openings to reach a respective one of the board-to-board electrical connectors on the electrical backplane.

Another aspect provides gas delivery system comprising an electrical backplane; a system controller operatively coupled to and physically mounted to the electrical backplane; a plurality of controlled modules, each including respective circuitry operatively coupled to the electrical backplane, the system controller and each controlled module being physically mounted to the electrical backplane. The controlled modules are selected from the group consisting of a mass flow controller, a flow ratio controller, and a pressure controller. The electrical backplane includes an electrical bus system having a control bus configured to route control signals between the system controller and each controlled mass flow controller, a first memory interface with read registers and write registers for exchanging data between the system controller and the electrical bus system, and a second memory interface with read registers and write registers for exchanging data between the controlled modules and the electrical bus system. In this aspect, additionally or alternatively, the system controller may be further configured to collect valve position information and sensor information from at least a plurality of sensors and valves that are operatively coupled to each printed circuit board of each controlled module and store the valve position information and sensor information into data logs stored in non-volatile memory on the electrical backplane. In this aspect, additionally or alternatively, the system controller may be further configured to execute an artificial intelligence (AI) model stored in non-volatile memory to, at training time, train the AI model on the sensor information from the plurality of sensors and on the valve position information from the plurality of valves during a golden manufacturing process, and, at run-time, determine a variance in performance of a run-time manufacturing process relative to the golden manufacturing process using the trained AI model. In this aspect, additionally or alternatively, electrical bus system may further include a configuration bus configured to route configuration signals between the system controller and each controlled mass flow controller. In this aspect, additionally or alternatively, electrical bus system may further include a power bus configured to supply power to each mass flow control circuitry, the system controller, and a plurality of valves.

In some embodiments, the methods and processes described herein may be tied to a computing system of one or more computing devices. In particular, such methods and processes may be implemented as a computer-application program or service, an application-programming interface (API), a library, and/or other computer-program product.

Figure 13:
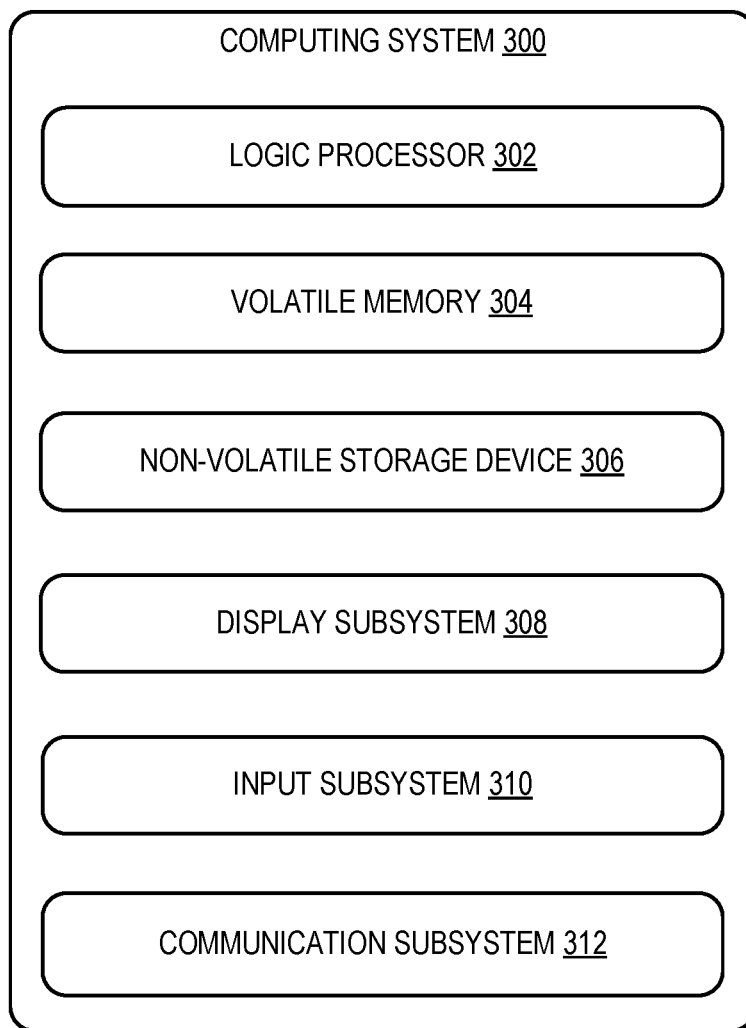
FIG. 13 shows a schematic view of an example computing environment that may be utilized to implement the gas delivery system of FIG. 1.

FIG. 13 schematically shows a non-limiting embodiment of a computing system 300 that can enact one or more of the processes described above. Computing system 300 is shown in simplified form. Computing system 300 may embody the system controller 12 or controlled modules 20, 24A-24D, 26A-26D, 30A-30P described above and illustrated in FIGS. 1-4.

Computing system 300 includes a logic processor 302 volatile memory 304, and a non-volatile storage device 306. Computing system 300 may optionally include a display subsystem 308, input subsystem 310, communication subsystem 312, and/or other components not shown in FIG. 13.

Logic processor 302 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 302 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 306 includes one or more physical devices configured to hold instructions executable by the logic processors to implement the methods and processes described herein. When such methods and processes are implemented, the state of non-volatile storage device 306 may be transformed—e.g., to hold different data.

Non-volatile storage device 306 may include physical devices that are removable and/or built-in. Non-volatile storage device 306 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 306 may include nonvolatile, dynamic, static, read/write, read-only, sequential-access, location-addressable, file-addressable, and/or content-addressable devices. It will be appreciated that non-volatile storage device 306 is configured to hold instructions even when power is cut to the non-volatile storage device 306.

Volatile memory 304 may include physical devices that include random access memory. Volatile memory 304 is typically utilized by logic processor 302 to temporarily store information during processing of software instructions. It will be appreciated that volatile memory 304 typically does not continue to store instructions when power is cut to the volatile memory 304.

Aspects of logic processor 302, volatile memory 304, and non-volatile storage device 306 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 300 typically implemented in software by a processor to perform a particular function using portions of volatile memory, which function involves transformative processing that specially configures the processor to perform the function. Thus, a module, program, or engine may be instantiated via logic processor 302 executing instructions held by non-volatile storage device 306, using portions of volatile memory 304. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 308 may be used to present a visual representation of data held by non-volatile storage device 306. The visual representation may take the form of a graphical user interface (GUI). As the herein described methods and processes change the data held by the non-volatile storage device, and thus transform the state of the non-volatile storage device, the state of display subsystem 308 may likewise be transformed to visually represent changes in the underlying data. Display subsystem 308 may include one or more display devices utilizing virtually any type of technology. Such display devices may be combined with logic processor 302, volatile memory 304, and/or non-volatile storage device 306 in a shared enclosure, or such display devices may be peripheral display devices.

When included, input subsystem 310 may comprise or interface with one or more user-input devices such as a keyboard, mouse, touch screen, etc.

When included, communication subsystem 312 may be configured to communicatively couple various computing devices described herein with each other, and with other devices. Communication subsystem 312 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 300 to send and/or receive messages to and/or from other devices via a network such as the Internet.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A gas delivery system comprising:
an electrical backplane;
a system controller operatively coupled to the electrical backplane; and
a plurality of mass flow controllers, each including respective mass flow control circuitry operatively coupled to the electrical backplane, the system controller and each mass flow control circuitry being physically mounted to the electrical backplane, wherein
each mass flow controller is physically mounted on the electrical backplane via a respective electrical connector;
the electrical backplane includes a backplane printed circuit board; and
each mass flow control circuitry includes a respective local printed circuit board that is physically mounted on the electrical backplane via a board-to-board electrical connection between the local printed circuit board and the backplane printed circuit board.

2. The gas delivery system of claim 1, further comprising:
a mechanical backplane onto which the plurality of mass flow controllers are physically mounted.

3. The gas delivery system of claim 2, wherein
the mechanical backplane includes a top surface, a bottom surface, and a plurality of openings extending from the top surface to the bottom surface;
the electrical backplane is mounted to the bottom surface of the mechanical backplane and is spaced apart from the bottom surface by a gap;
each mass flow controller is mounted to the top surface of the mechanical backplane; and
a portion of each mass flow controller mass flow controller extends through a respective opening of the plurality of openings to reach the electrical backplane.

4. The gas delivery system of claim 3, wherein the mass flow controllers are mounted in rows, each row including an associated flow path extending from a respective inlet to a mixing manifold.

5. The gas delivery system of claim 4, wherein the mass flow controllers are selected from the group consisting of a pressure mass flow controller, a thermal mass flow controller, and a restrictor-less mass flow controller.

6. The gas delivery system of claim 4, wherein each mass flow controller includes:
a mass flow controller flow block including a flow path from an inlet to an outlet of the mass flow controller flow block;
a flow control valve mounted in the flow path and configured to control a flow rate of gas flowing through the flow path;
a pressure sensor pair comprising a first pressure sensor and a second pressure sensor positioned on opposite sides of a restrictor in the flow path; and
an upstream pressure sensor mounted upstream of the restrictor and configured to measure pressure in a flow channel adjacent the flow control valve.

7. The gas delivery system of claim 6, wherein,
in each row, each mass flow controller has an associated upstream flow block;
each upstream flow block includes an inlet, an outlet, and a purge port,
each upstream flow block includes a branching flow path including an inlet branch from the inlet to a branch point, an outlet branch leading from the branch point to the outlet, and a purge branch leading from the branch point to the purge port;
an upstream shutoff valve positioned in the inlet branch and configured to control flow of gas from the inlet to the outlet along the outlet branch; and
an upstream purge shutoff valve positioned in the purge branch and configured to control flow of gas from the inlet to the purge port.

8. The gas delivery system of claim 7, wherein
in each row, each mass flow controller has an associated downstream flow block;
each downstream flow block includes an inlet, an outlet, and a purge port,
each downstream flow block includes a branching flow path including an inlet branch from the inlet to a branch point, an outlet branch leading from the branch point to the outlet, and a purge branch leading from the branch point to the purge port;
a downstream purge shutoff valve is positioned in the purge branch and configured to control flow of gas from the inlet to the purge port; and
a downstream shutoff valve is positioned in the inlet branch and configured to control flow of gas from the inlet to the outlet along the outlet branch.

9. The gas delivery system of claim 8, wherein at least one of the upstream and downstream flow blocks includes:
an internal channel extending horizontally and being positioned between a top surface and a bottom surface of the upstream or downstream flow block, the internal channel forming a portion of the purge branch of the flow path.

10. The gas delivery system of claim 9, wherein
the internal channel is fluidically connected to one of the upstream purge shutoff valve or the downstream purge shutoff valve via a first vertical channel;
the internal channel is fluidically connected to the purge port via a second vertical channel; and
the one of the upstream purge shutoff valve or downstream purge shutoff valve being positioned closer to the outlet than the inlet.

11. The gas delivery system of claim 10, wherein the internal channel is formed by an additive manufacturing process.

12. The gas delivery system of claim 1, further comprising:
a plurality of flow ratio controllers, each including respective flow ratio control circuitry operatively coupled to the electrical backplane, the flow ratio control circuitry being physically mounted to the electrical backplane.

13. The gas delivery system of claim 12, further comprising:
a mixing manifold configured to receive gas from each mass flow controller, mix the gas, and guide the gas to respective inlets of each of the flow ratio controllers.

14. The gas delivery system of claim 1, further comprising:
a plurality of pressure controllers, each including respective pressure control circuitry operatively coupled to the electrical backplane, the pressure control circuitry being physically mounted to the electrical backplane.

15. The gas delivery system of claim 1, wherein the electrical backplane includes:
an electrical bus system including a control bus configured to route control signals between the system controller and each controlled mass flow controller.

16. The gas delivery system of claim 1, wherein the electrical backplane further includes:
an electrical bus system including a configuration bus configured to route configuration signals between the system controller and each controlled mass flow controller.

17. The gas delivery system of claim 1, wherein the electrical backplane includes:
a power bus configured to supply power to each mass flow control circuitry, the system controller, and a plurality of valves.

18. The gas delivery system of claim 1, further comprising non-volatile memory operatively coupled to the system controller, wherein
the system controller is further configured to collect valve position information and sensor information from at least a plurality of sensors and valves that are operatively coupled to each mass flow control circuitry and store the valve position information and sensor information into data logs stored in the non-volatile memory.

19. The gas delivery system of claim 1, further comprising:
a coprocessor mounted to the electrical backplane, wherein
the coprocessor coordinates asynchronous data communications between the system controller and each mass flow control circuitry.

20. The gas delivery system of claim 19, wherein
the coprocessor deserializes serialized data streams from each mass flow control circuitry to generate deserialized data streams, and sends the deserialized data streams to the system controller; and
the coprocessor further serializes data streams from the system controller to generate serialized data streams, and sends the serialized data streams to each mass flow control circuitry.

21. The gas delivery system of claim 20, wherein
each data stream includes an address of the mass flow control circuitry from which the data stream was sent.

22. A gas delivery system comprising:
an electrical backplane comprising a backplane printed circuit board;
a system controller operatively coupled to and physically mounted to the electrical backplane printed circuit board; and
a plurality of controlled modules, each including a respective local printed circuit board operatively coupled to the backplane printed circuit board, the local printed circuit board of each controlled module being electrically connected to and physically mounted to the backplane printed circuit board via a board-to-board electrical connector between the local printed circuit board and the backplane printed circuit board;
wherein the controlled modules are selected from the group consisting of a mass flow controller, a flow ratio controller, a pressure controller, an external bus extension, a precursor module, an in-situ metrology system, a thermal-based mass flow controller, and a restrictorless mass flow controller.

23. The gas delivery system of claim 22, further comprising non-volatile memory mounted to the electrical backplane and operatively coupled to the system controller, wherein
the system controller is further configured to collect valve position information and sensor information from at least a plurality of sensors and valves that are operatively coupled to each printed circuit board of each controlled module and store the valve position information and sensor information into data logs stored in the non-volatile memory.

24. The gas delivery system of claim 22, further comprising:
a mechanical backplane onto which the plurality of controlled modules are physically mounted, the mechanical backplane including a top surface, a bottom surface, and a plurality of openings extending from the top surface to the bottom surface, wherein
the electrical backplane is mounted to the bottom surface of the mechanical backplane and is spaced apart from the bottom surface by a gap;
each controlled module is mounted to the top surface of the mechanical backplane; and
a portion of the printed circuit board of each controlled module extends through a respective opening of the plurality of openings to reach a respective one of the board-to-board electrical connectors on the electrical backplane.

25. A gas delivery system comprising:
an electrical backplane comprising a backplane printed circuit board;
a system controller operatively coupled to and physically mounted to the electrical backplane;
a plurality of controlled modules, each including a respective local printed circuit board operatively coupled to the electrical backplane, the system controller and the respective local printed circuit board of each controlled module being physically mounted to the electrical backplane via a respective electrical connector establishing a board-to-board electrical connection between the local printed circuit board and the backplane printed circuit board, wherein the controlled modules are selected from the group consisting of a mass flow controller, a flow ratio controller, and a pressure controller, wherein
the electrical backplane includes an electrical bus system having
a control bus configured to route control signals between the system controller and each controlled mass flow controller, a first memory interface with read registers and write registers for exchanging data between the system controller and the electrical bus system, and a second memory interface with read registers and write registers for exchanging data between the controlled modules and the electrical bus system.

26. The gas delivery system of claim 25, wherein the system controller is further configured to collect valve position information and sensor information from at least a plurality of sensors and valves that are operatively coupled to each printed circuit board of each controlled module and store the valve position information and sensor information into data logs stored in non-volatile memory on the electrical backplane.

27. The gas delivery system of claim 26, wherein the system controller is further configured to execute an artificial intelligence (AI) model stored in non-volatile memory to, at training time, train the AI model on the sensor information from the plurality of sensors and on the valve position information from the plurality of valves during a golden manufacturing process, and, at run-time, determine a variance in performance of a run-time manufacturing process relative to the golden manufacturing process using the trained AI model.

28. The gas delivery system of claim 25, wherein electrical bus system further includes a configuration bus configured to route configuration signals between the system controller and each controlled mass flow controller.

29. The gas delivery system of claim 25, wherein electrical bus system further includes a power bus configured to supply power to each mass flow control circuitry, the system controller, and a plurality of valves.

* * * * *

UNITED STATES PATENT AND TRADEMARK OFFICE
CERTIFICATE OF CORRECTION

| | | |
|---|---|---|
| PATENT NO. | : 11,789,472 B2 | |
| APPLICATION NO. | : 17/090019 | |
| DATED | : October 17, 2023 | |
| INVENTOR(S) | : Edward Cocciadiferro et al. | |

It is certified that error appears in the above-identified patent and that said Letters Patent is hereby corrected as shown below:

In the Claims

Column 30, Line 2, delete "electrical"

Signed and Sealed this
Twenty-third Day of January, 2024

Katherine Kelly Vidal
*Director of the United States Patent and Trademark Office*